(12) United States Patent
Liaw

(10) Patent No.: US 11,950,401 B2
(45) Date of Patent: *Apr. 2, 2024

(54) TWO-PORT SRAM CELLS WITH ASYMMETRIC M1 METALIZATION

(71) Applicant: Taiwan Semiconductor Manufacturing Company, Ltd., Hsinchu (TW)

(72) Inventor: Jhon Jhy Liaw, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/877,317

(22) Filed: Jul. 29, 2022

(65) Prior Publication Data
US 2022/0384457 A1 Dec. 1, 2022

Related U.S. Application Data

(63) Continuation of application No. 17/334,081, filed on May 28, 2021, now Pat. No. 11,488,969.
(Continued)

(51) Int. Cl.
*H10B 10/00* (2023.01)
*H01L 27/092* (2006.01)
(Continued)

(52) U.S. Cl.
CPC ....... *H10B 10/125* (2023.02); *H01L 27/0924* (2013.01); *H01L 29/0665* (2013.01);
(Continued)

(58) Field of Classification Search
CPC ....... G11C 16/30; G11C 16/0483; G11C 8/16; G11C 11/412; H01L 29/41775;
(Continued)

(56) References Cited

U.S. PATENT DOCUMENTS 7,233,032 B2 6/2007 Liaw
8,144,540 B2 3/2012 Liaw
(Continued)

OTHER PUBLICATIONS

Jhon Jhy Liaw, Integrated Circuit With Embedded High-Density And High-Current SRAM Macros, U.S. Appl. No. 17/187,068, filed Feb. 26, 2021, Assignee: Taiwan Semiconductor Manufacturing Company, Ltd., Specification 43 pages, Drawings 33 pages.

*Primary Examiner* — Changhyun Yi
(74) *Attorney, Agent, or Firm* — Haynes and Boone, LLP

(57) ABSTRACT

A semiconductor structure includes a substrate and an array of two-port (TP) SRAM cells. Each TP SRAM cell includes a write port and a read port. The array includes first and second TP SRAM cells. The write ports of the first and second TP SRAM cells abut each other. The write port of the first TP SRAM cell includes a first write pull-down (W_PD) transistor. The write port of the second TP SRAM cell includes a second W_PD transistor. The array of TP SRAM cells further includes a first source/drain contact landing on both a source/drain electrode of the first W_PD transistor and another source/drain electrode of the second W_PD transistor. The first TP SRAM cell includes a first Vss conductor located at a first metal layer. The first Vss conductor is directly above the first source/drain contact and connected to the first source/drain contact.

20 Claims, 20 Drawing Sheets

Related U.S. Application Data

(60) Provisional application No. 63/172,523, filed on Apr. 8, 2021.

(51) Int. Cl.
  *H01L 29/06* (2006.01)
  *H01L 29/417* (2006.01)
  *H01L 29/423* (2006.01)
  *H01L 29/78* (2006.01)
  *H01L 29/786* (2006.01)

(52) U.S. Cl.
  CPC .. *H01L 29/41733* (2013.01); *H01L 29/41775* (2013.01); *H01L 29/41791* (2013.01); *H01L 29/42392* (2013.01); *H01L 29/785* (2013.01); *H01L 29/78618* (2013.01); *H10B 10/18* (2023.02)

(58) Field of Classification Search
  CPC .. H01L 27/0924; H01L 27/1108; H01L 27/11; H01L 29/0665; H01L 29/41733; H01L 29/41791; H01L 29/78618; H10B 10/125
  See application file for complete search history.

(56) References Cited

U.S. PATENT DOCUMENTS

| | | |
|---|---|---|
| 9,024,392 B2 | 5/2015 | Liaw |
| 9,257,439 B2 | 2/2016 | Liaw |
| 9,640,540 B1 | 5/2017 | Liaw |
| 9,672,903 B2 | 6/2017 | Liaw |
| 9,892,781 B2 | 2/2018 | Liaw |
| 10,128,253 B2 | 11/2018 | Liaw |
| 11,488,969 B1 * | 11/2022 | Liaw ............ H10B 10/18 |
| 2013/0154027 A1 | 6/2013 | Liaw |
| 2014/0133218 A1 | 5/2014 | Liaw |
| 2022/0093613 A1 | 3/2022 | Moriwaki |

* cited by examiner

TWO-PORT SRAM CELLS WITH ASYMMETRIC M1 METALIZATION

PRIORITY

This is a continuation of U.S. patent application Ser. No. 17/334,081, filed May 28, 2021, which claims the benefits to the U.S. Prov. App. Ser. No. 63/172,523, filed Apr. 8, 2021, the entire disclosure of which is incorporated herein by reference.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology. One such advance is desired in embedded memory design. For example, how to provide two-port memory cells with optimized routing for bit lines and Vss (or ground) conductors to meet fast cache memory requirements, such as L1 cache memories, in advanced process nodes.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2-1, 2-2, and 2-3 show different layers of the layout of FIG. 2.

FIG. 3 shows certain layers of a layout of a portion of the memory array of FIG. 1A, in accordance with an embodiment where the memory cells in the memory array are TP SRAM cells and the transistors are GAA transistors.

FIGS. 3-1, 3-2, and 3-3 show different layers of the layout of FIG. 3.

FIGS. 4-1, 4-2, and 4-3 shows certain layers of a layout of a portion of the memory array of FIG. 1A, in accordance with an embodiment.

FIGS. 5-1 and 5-2 show the layout of a portion of the memory array of FIG. 1A, in accordance with an embodiment.

DETAILED DESCRIPTION

Figure 1A:
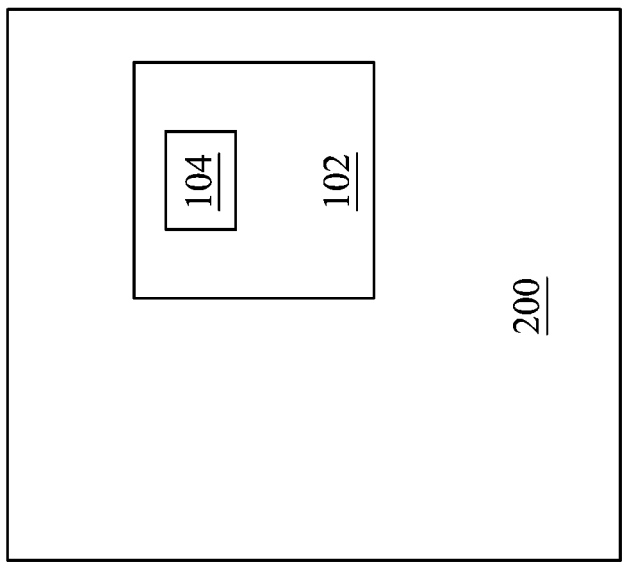
FIG. 1A is a simplified block diagram of an integrated circuit (IC) with a memory array, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

This application relates to semiconductor structures and fabrication processes thereof, and more particularly to integrated circuits (IC) having two-port (TP) SRAM cells with optimized routing (such as at the first metallization (M1) layer) for bit lines and Vss (or ground) conductors as well as other conductors to meet fast cache memory requirements, such as L1 cache memories. A TP SRAM cell refers to a SRAM (static random access memory) cell with a read port and a write port. A TP SRAM cell allows separate tuning for the write port and the read port at both the device level and the cell layout level so that the write port can provide low Vcc_min (or V_min) for improved cell stability while the read port can have high Ion (on current) for fast read speed. SRAM bit-lines are put in the lowest level metallization layer (M1: 1$^{st}$ metal layer) for bit-line capacitance reduction purposes. As metal thickness and line width continuously shrink in the advanced semiconductor processes, an issue arises that the resistance in SRAM bit-line and Vss conductors might be increased and therefore impact the cell speed and V_min performance. The increase in Vss conductors' resistance raises IR drop issues. This application presents a new cell metal routing structure to alleviate the metal routing issues for TP SRAM cells.

Particularly, in an embodiment of the present disclosure, two adjacent TP SRAM cells shares a common Vss conductor and a common write word line (W_WL) landing pad at the M1 layer. The shared W_WL landing pad provides a landing area for connecting to W_WL conductors at higher metal layers (such as the M2 layer which is the second metal layer). The shared Vss conductor may be placed in one of the two cells and the shared W_WL landing pad is placed in the other one of the two cells. The rest of the layout of the two TP SRAM cells are mirror image (or have substantially reflection symmetry) with respect to a boundary line between the two cells. But, because of the placement of the shared Vss conductor and the shared W_WL landing pad, the layout of the two TP SRAM cells become asymmetric to each other. This asymmetry may raise some challenges for the layout of a memory array, which will be resolved according to embodiments of the present disclosure. By sharing the Vss conductor and the W_WL landing pad between the two TP SRAM cells, the total number of metal routing at the M1 layer for the two TP SRAM cells is reduced. This means that the metal routings at the M1 layer (such as write bit line, write bit line bar, Vdd, Vss, read bit line, read word line landing pad, and W_WL landing pad) can be spaced apart a bit further to reduce coupling capacitance and/or some of the metal routings can be made wider to reduce resistance.

Embodiments of the present disclosure can be implemented with FinFET transistors or gate-all-around (GAA) transistors. GAA transistors refer to transistors having gate stacks (gate electrodes and gate dielectric layers) surrounding transistor channels, such as vertically-stacked gate-all-around horizontal nanowire or nanosheet MOSFET devices. Those of ordinary skill in the art should appreciate that they may readily use the present disclosure as a basis for designing or modifying other structures for carrying out the same purposes and/or achieving the same advantages of the embodiments introduced herein.

FIG. 1A shows a semiconductor device (or device or IC) 200. The semiconductor device 200 can be, e.g., a microprocessor, an application specific integrated circuit (ASIC), a field programmable gate array (FPGA), a digital signal processor (DSP), or a portion thereof, that includes various passive and active microelectronic devices such as resistors, capacitors, inductors, diodes, p-type field effect transistors (PFETs), n-type field effect transistors (NFETs), FinFET, GAA transistors (such as nanosheet FETs or nanowire FETs), other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, memory devices, other suitable components, or combinations thereof. The exact functionality of the semiconductor device 200 is not a limitation to the provided subject matter.

Figure 1B:
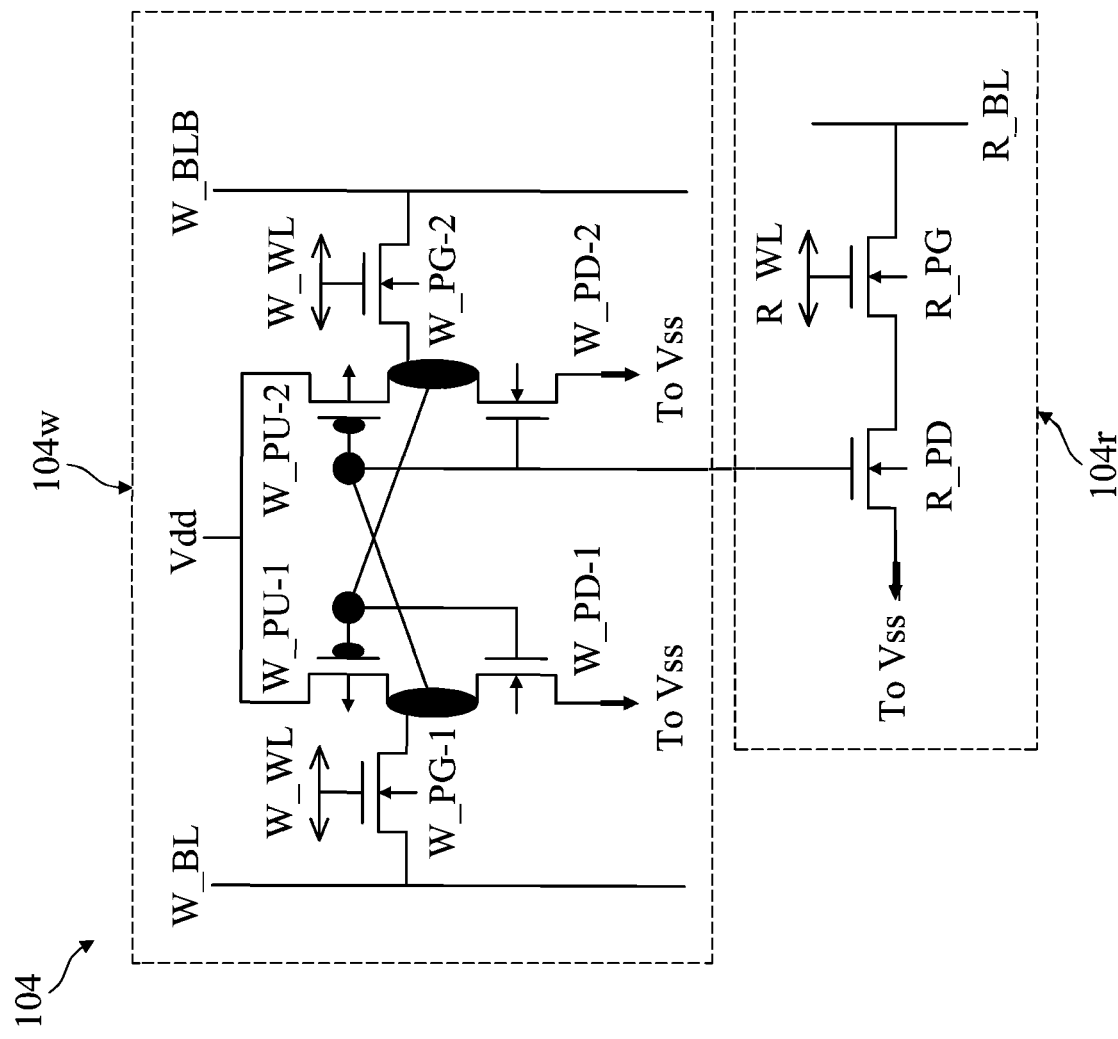
FIG. 1B shows a schematic view of a two-port (TP) SRAM cell, in accordance with an embodiment.

In the present embodiment, the semiconductor device 200 includes an SRAM macro 102. The SRAM macro 102 includes many SRAM cells 104 that may be arranged as a memory array (or an array of memory cells), and further includes peripheral logic circuits. The SRAM cells 104 store data. The peripheral logic circuits perform address decoding and read/write operations from/to the SRAM cells 104. In the present embodiment, each SRAM cell 104 is a two port (TP) SRAM cell. A schematic representation of the TP SRAM cell 104 is shown in FIG. 1B. In various embodiments, the SRAM macro 102 may include other types of memory cells, such as single-port memory cells.

Referring to FIG. 1B, the TP SRAM cell 104 (or simply SRAM cell 104 or cell 104) includes a write port (or write port portion) 104w and a read port (or a read port portion) 104r. The write port 104w includes two PMOS transistors (or PMOSFET) as pull-up transistors W_PU-1 and W_PU-2; two NMOS transistors (or NMOSFET) as pull-down transistors W_PD-1 and W_PD-2; and two NMOS transistors as pass-gate (or access) transistors W_PG-1 and W_PG-2. The W_PU-1 and W_PD-1 are coupled to form an inverter. The W_PU-2 and W_PD-2 are coupled to form another inverter. The two inverters are cross-coupled to form data storage nodes. The W_PG-1 and W_PG-2 are coupled to the data storage nodes for writing thereto. The read port 104r includes an NMOS transistor as a pull-down transistors R_PD and another NMOS transistor as a pass-gate (or access) transistor R_PG. FIG. 1B further shows write word line (W_WL), write bit line (W_BL), and write bit line bar (W_BLB or inverse write bit line) for writing the data storage node of the SRAM cell 104, read word line (R_WL) and read bit line (R_BL) for reading the data storage node of the SRAM cell 104, positive power supply Vdd, and negative power supply (or ground) Vss. In an embodiment, each of the transistors in the cell 104 is a FinFET transistor. In another embodiment, each of the transistors in the cell 104 is a GAA transistor.

Figure 2:
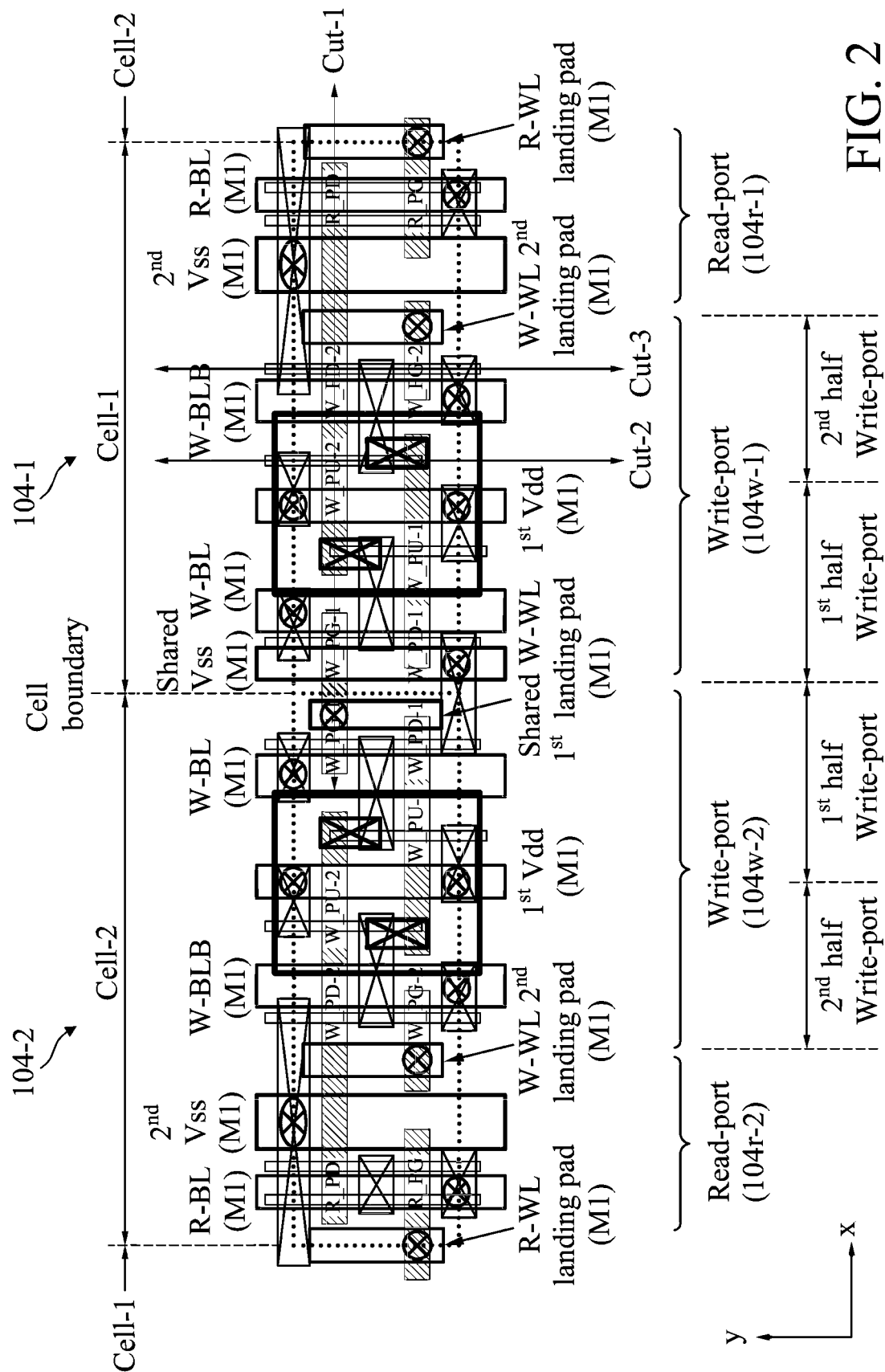
FIG. 2 shows certain layers of a layout of a portion of the memory array of FIG. 1A, in accordance with an embodiment where the memory cells in the memory array are TP SRAM cells and the transistors are FinFET.
Figures 1, 2:
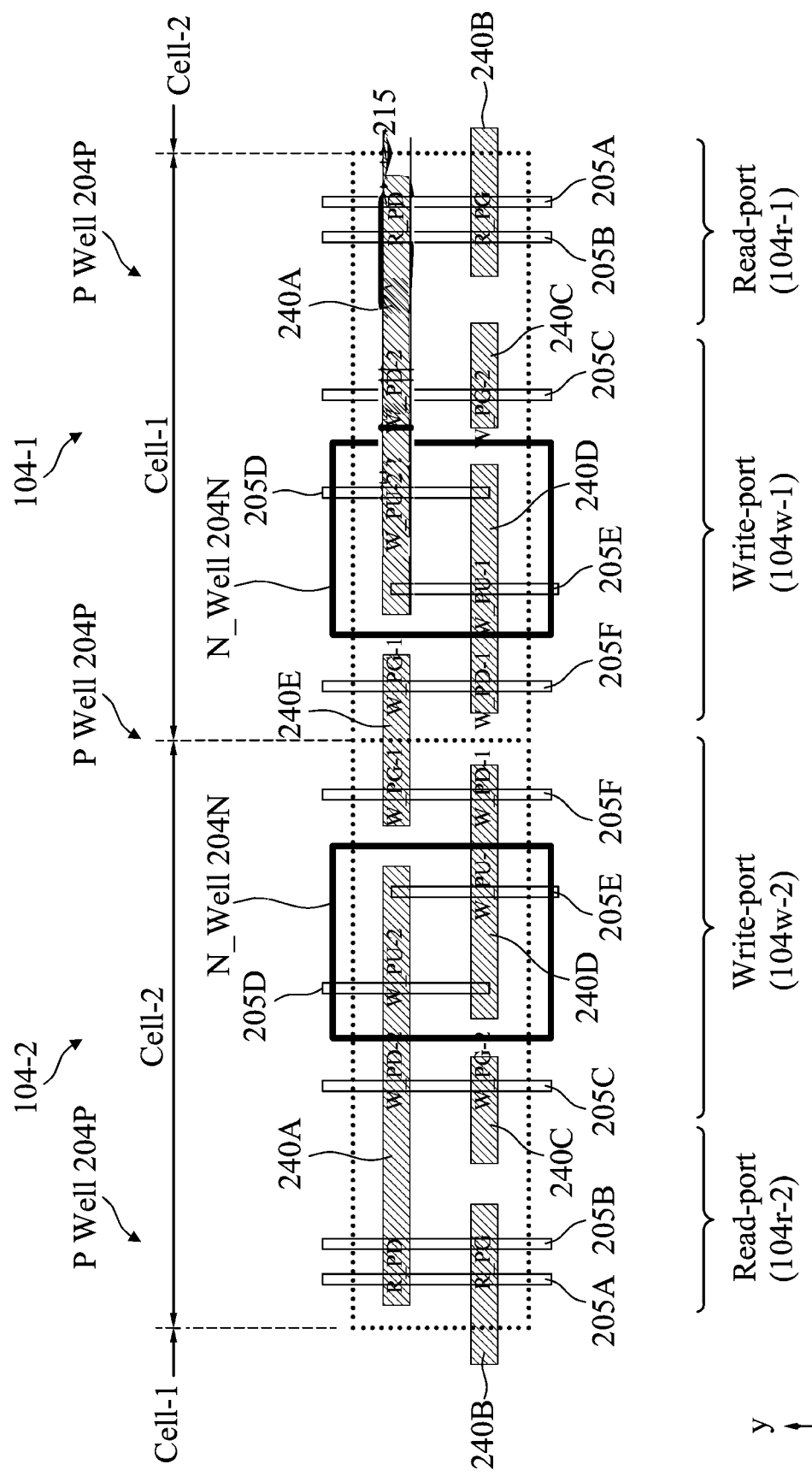
Figure 2:
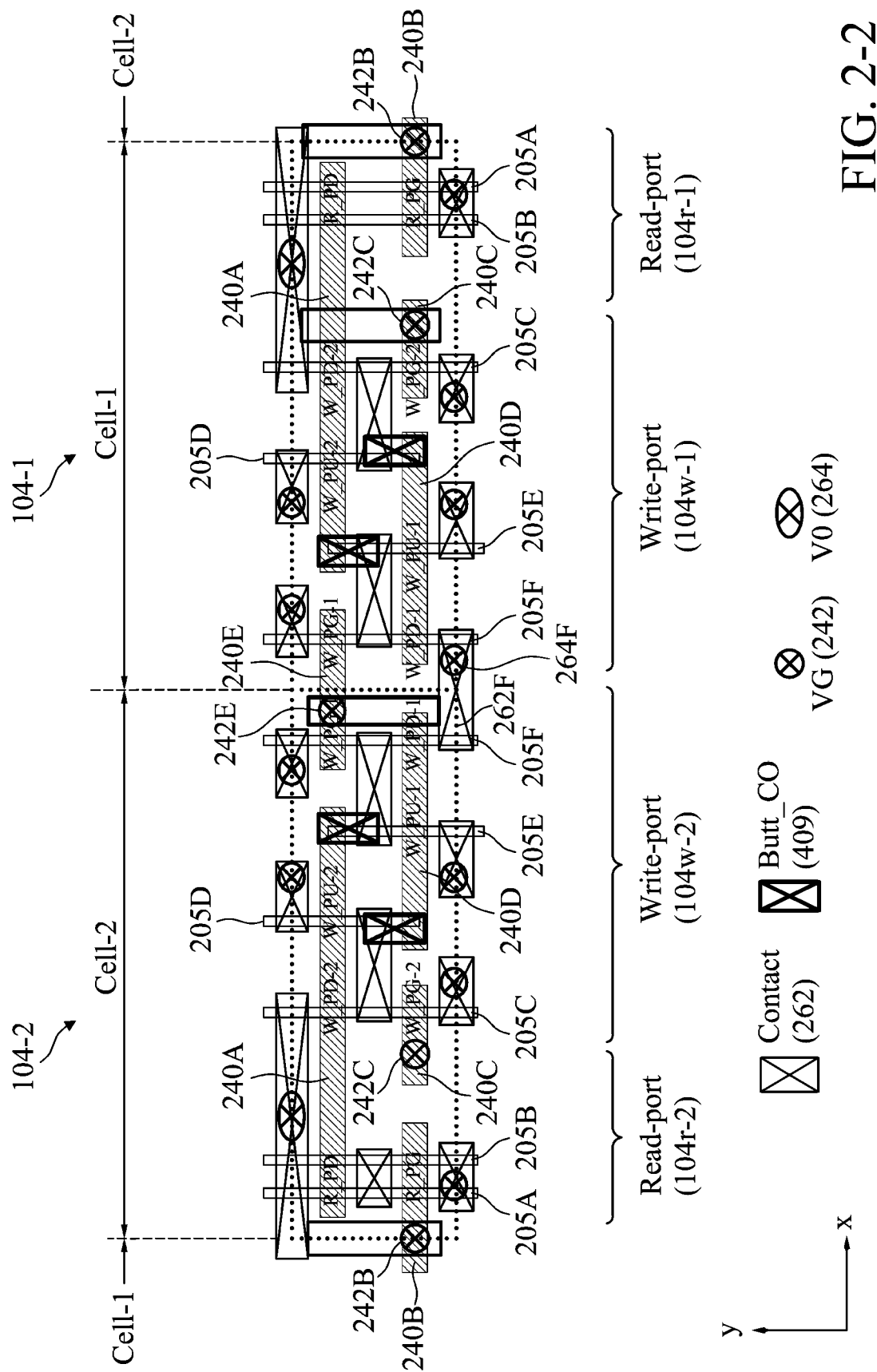
Figures 2, 3:
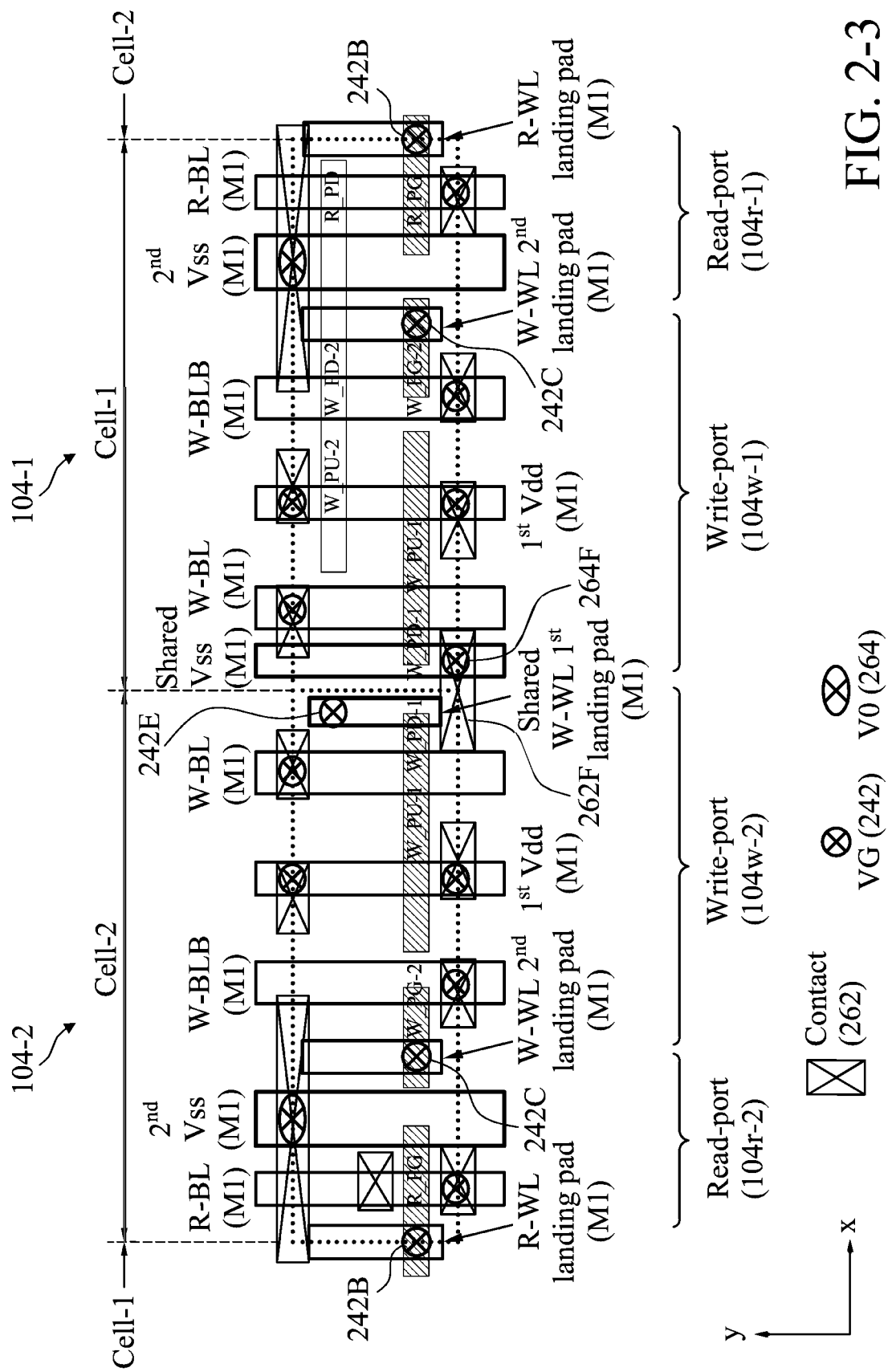
Figure 3:
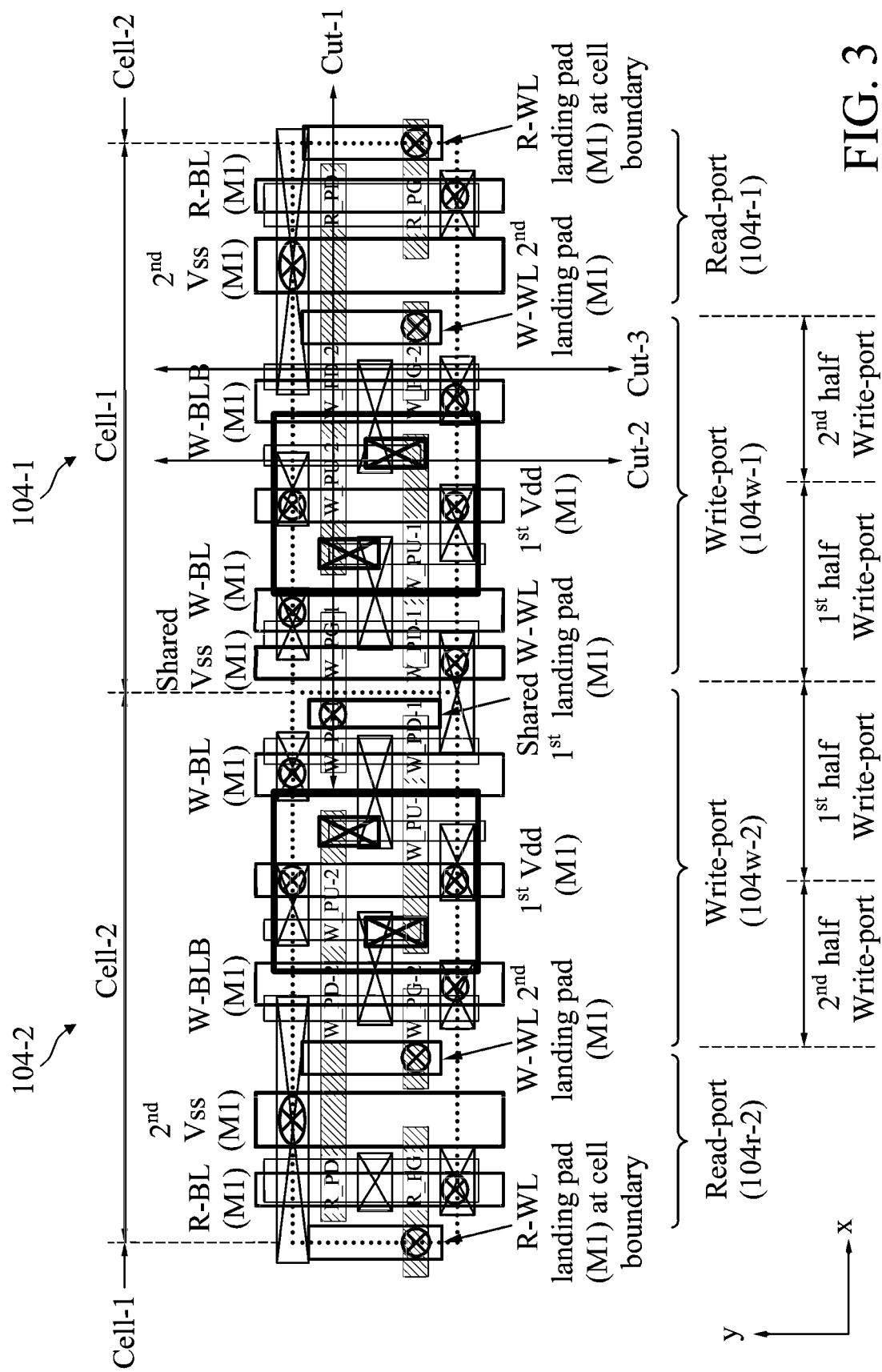
Figures 1, 3:
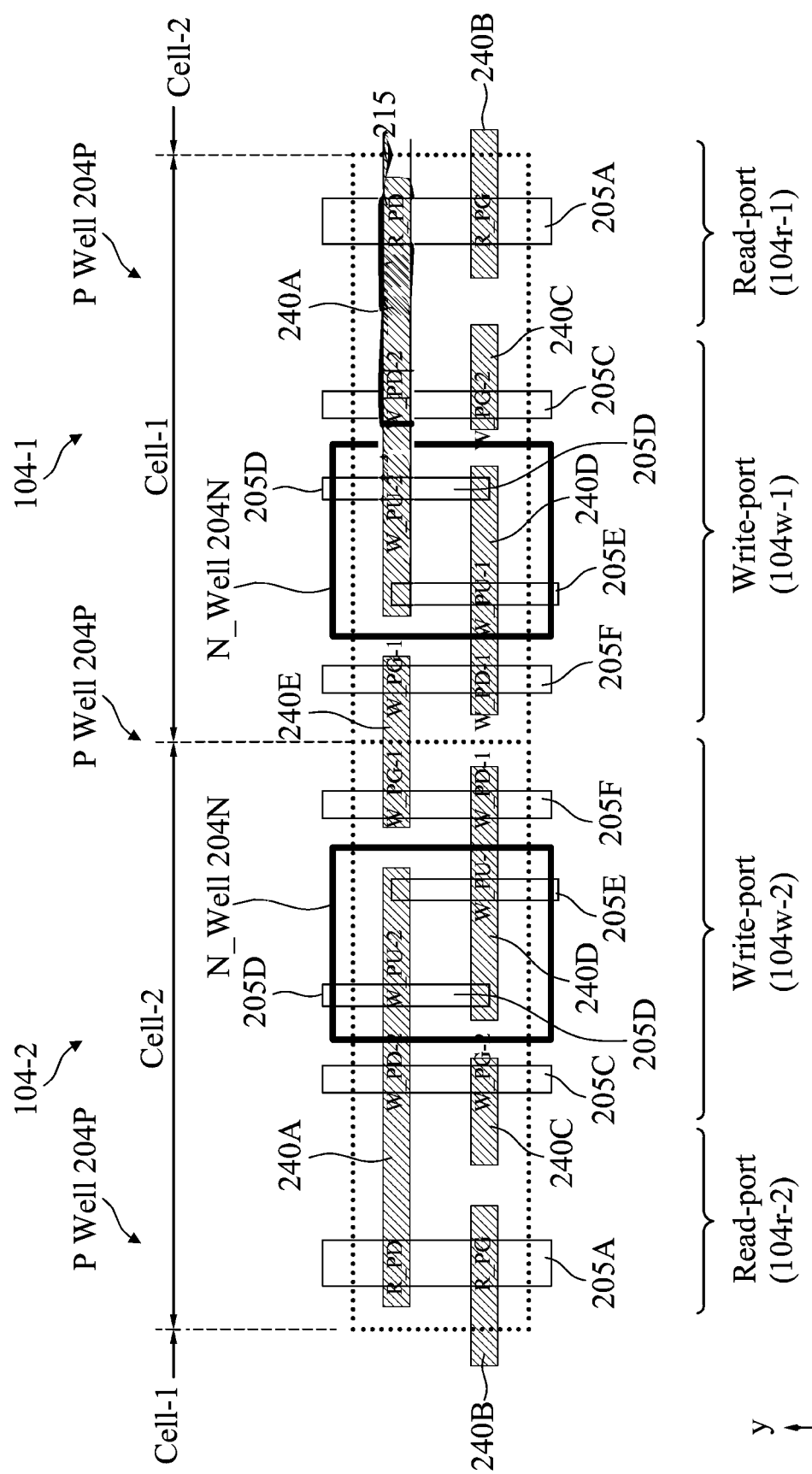
Figures 2, 3:
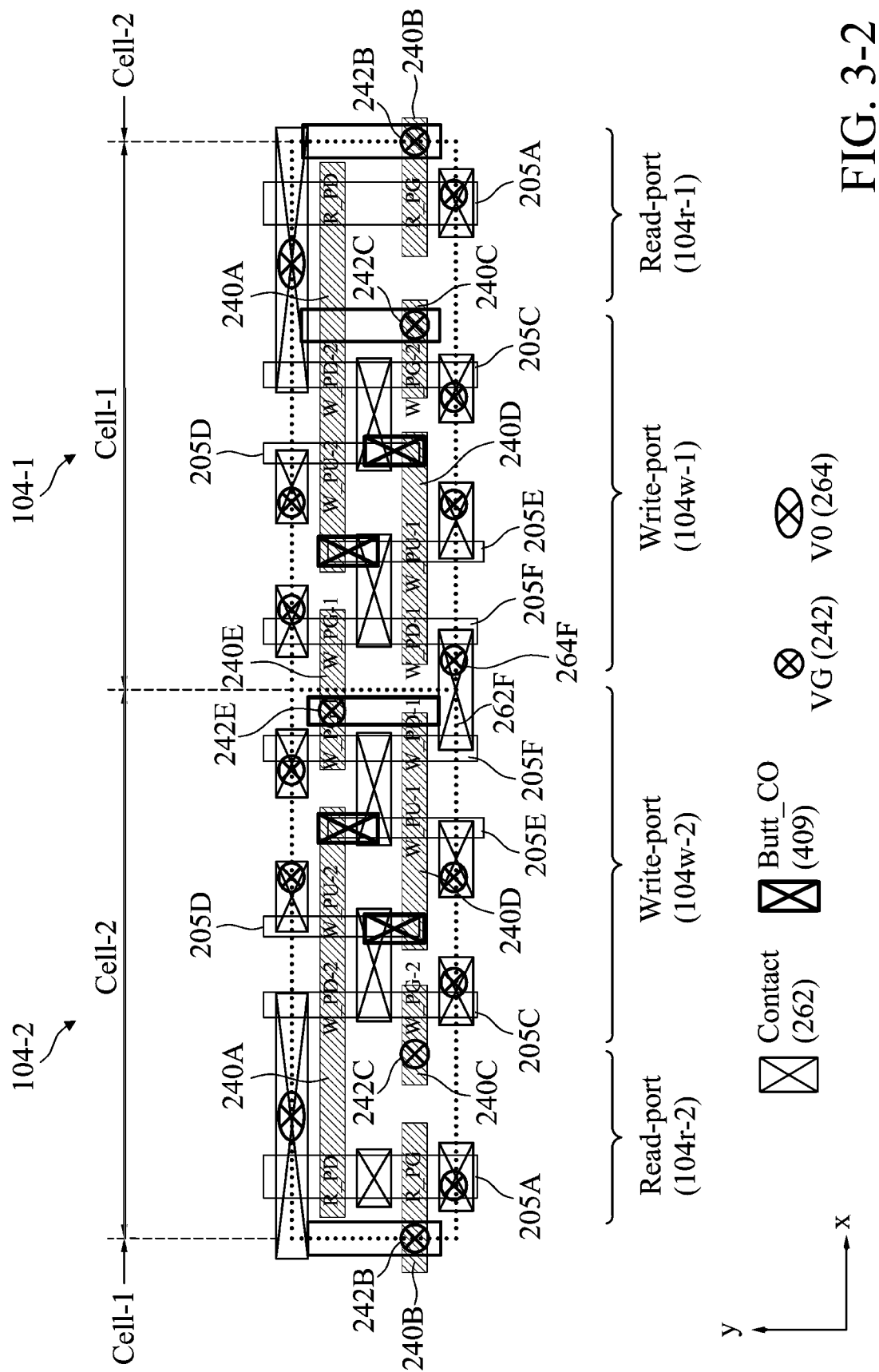
Figure 3:
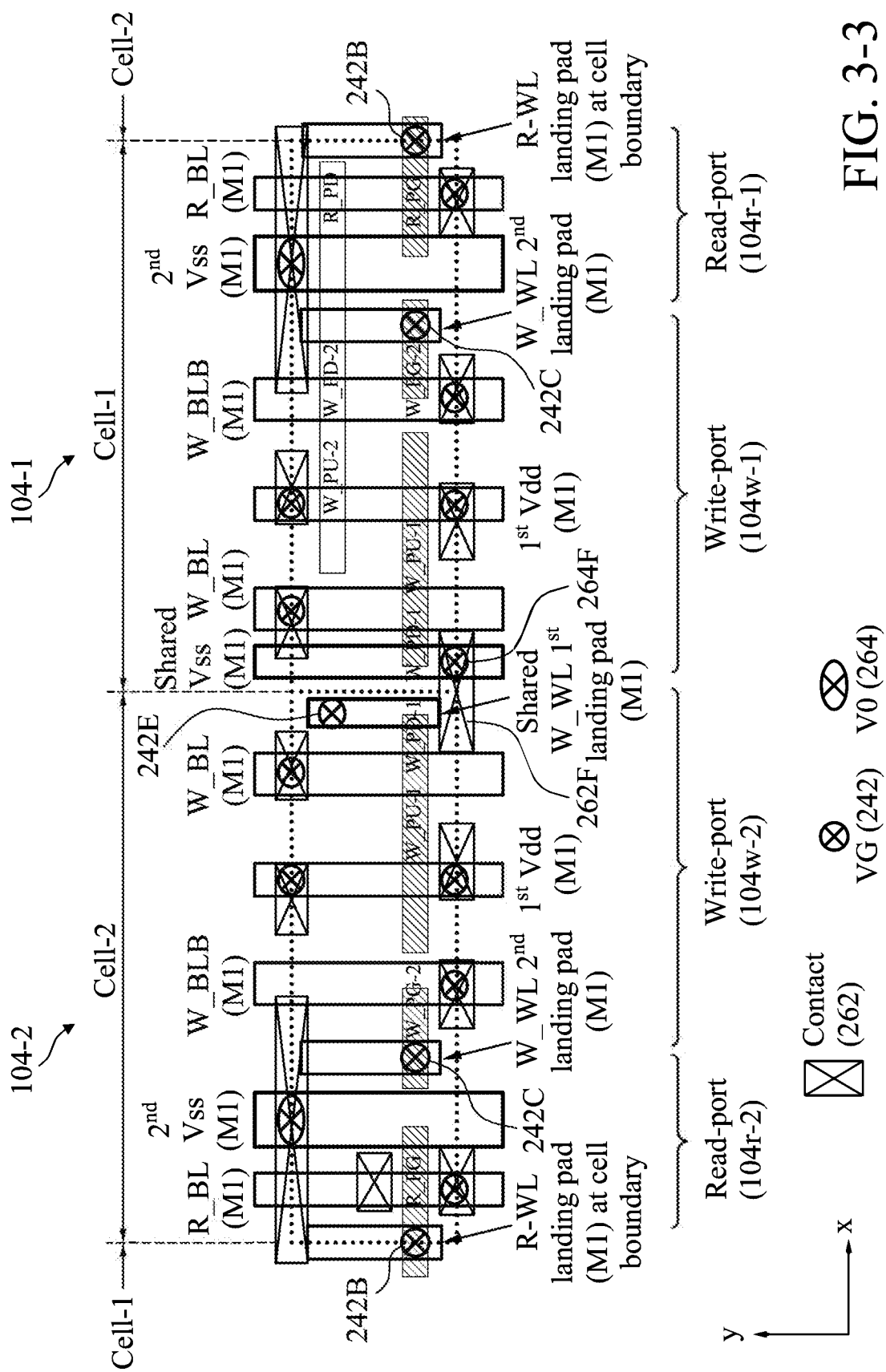

FIG. 2 shows a layout of the SRAM macro 102, particularly, a layout of certain layers (or features) of the TP SRAM cells 104 according to an embodiment where the cells 104 include FinFET transistors. FIGS. 2-1, 2-2, and 2-3 show different layers of the layout of FIG. 2 for clarity purposes. The following discussion may refer to FIGS. 2, 2-1, 2-2, and 2-3 collectively.

Referring to FIG. 2, two TP SRAM cells 104, 104-1 and 104-2, are placed side-by-side and share a cell boundary line. They are referred to as "Cell-1" and "Cell-2," respectively. The cells 104-1 and 104-2 have asymmetric layouts, for example, in the M1 layer. In FIG. 2, a first Cell-2 is placed to the left of a first Cell-1, a second Cell-2 is placed to the right of the first Cell-1, a second Cell-1 (not shown) is placed to the right of the second Cell-2, so on and so forth, to make up a row of cells 104. Each of the cells 104 occupies an area indicated by the dotted rectangular box. Each cell 104 has the same length (called the "X-pitch" in FIGS. 5-1 and 5-2) along the "x" direction and the same width (called the "Y-pitch" in FIGS. 5-1 and 5-2) along the "y" direction. The write port (104w-1) of Cell-1 is placed adjacent to (or abutting) the write port (104w-2) of Cell-2. The read port (104r-1) of Cell-1 is placed adjacent to (or abutting) the read port (not shown) of another Cell-2. The read port (104*r*-2) of Cell-2 is placed adjacent to (or abutting) the read port (not shown) of another Cell-1.

Each of the write ports (104*w*-1 and 104*w*-2) may be further divided into two halves: a first ($1^{st}$) half write port and a second ($2^{nd}$) half write port. The second half write port is located between the first half write port and the read port within each cell. The first half write port includes a first write pass gate transistor (W_PG-1), a first write pull-down transistor (W_PD-1), and a first write pull-up transistor (W_PU-1). The second half write port includes a second write pass gate transistor (W_PG-2), a second write pull-down transistor (W_PD-2), and a second write pull-up transistor (W_PU-2). The read port includes a read pass gate transistor (R_PG) and a read pull-down transistor (R_PD).

In the present embodiment, the layout of Cell-1 is a mirror image of the layout of Cell-2 with respect to the cell boundary, except two conductors in the M1 layer—a shared W-WL landing pad and a shared Vss conductor. In the embodiment depicted in FIG. 2, the shared W-WL landing pad is placed in Cell-2 and the shared Vss conductor is placed in Cell-1. In an alternative embodiment (not shown), the shared W-WL landing pad is placed in Cell-1 and the shared Vss conductor is placed in Cell-2. The two adjacent cells, Cell-1 and Cell-2 have three Vss conductors at the M1 layer. A first Vss conductor (the shared Vss conductor) is electrically connected to the source nodes of the W_PD-1 of Cell-1 and W_PD-1 of Cell-2. A second Vss conductor is electrically connected to the source nodes of W_PD-2 and R_PD of the Cell-1. A third Vss conductor is electrically connected to the source nodes of W_PD-2 and R_PD of the Cell-2.

FIG. 2-1 shows the layout of the SRAM cells 104 at the diffusion layer and the gate layer. Referring to FIG. 2-1, each cell 104 includes active regions 205 (including 205A, 205B, 205C, 205D, 205E, and 205F) that are oriented lengthwise along the "y" direction, and gate stacks 240 (including 240A, 240B, 240C, 240D, and 240E) that are oriented lengthwise along the "x" direction perpendicular to the "y" direction. The active regions 205D and 205E are disposed over an n-type well (or N Well) 204N. The active regions 205A, 205B, 205C, and 205F are disposed over p-type wells (or P Wells) 204P that are on both sides of the N well 204N along the "x" direction. The gate stacks 240 engage the channel layers 215 of the respective active regions 205 to form transistors (note that not all channel layers 215 are labeled in FIG. 2-1 for simplicity purposes). For example, the gate stack 240A engages the channel layers 215 of the active region 205A and 205B to form an NMOSFET as the read pull-down transistor R_PD (effectively, R-PD is a dual-fin FinFET in this embodiment), engages the channel layer 215 of the active region 205C to form an NMOSFET as the write pull-down transistor W_PD-2, and engages the channel region 215 of the active region 205D to form a PMOSFET as the write pull-up transistor W_PU-2. In other words, the R_PD, W_PD-2, and W_PU-2 share a common gate stack. The gate stack 240B engages the channel layer 215 of the active regions 205A and 205B to form an NMOSFET as the read pass-gate transistor R_PG (effectively, R-PD is a dual-fin FinFET in this embodiment). The gate stack 240C engages the channel layer 215 of the active region 205C to form an NMOSFET as the write pass-gate transistor W_PG-2. The gate stack 240D engages the channel layer 215 of the active region 205E to form a PMOSFET as the write pull-up transistor W_PU-1 and engages the channel region 215 of the active region 205F to form an NMOSFET as the write pull-down transistor W_PD-1. In other words, the W_PD-1 and W_PU-1 share a common gate stack. The gate stack 240E engages the channel layer 215 of the active region 205F to form an NMOSFET as the write pass-gate transistor W_PG-1. The gate stack 240E is shared between Cell-1 and Cell-2 and it engages the active region 205F in Cell-1 and the active region 205F in Cell-2. In other words, the W_PG-1 of Cell-1 and W_PG-1 of Cell-2 share a common gate stack. In the present embodiment, the layout of Cell-1 and Cell-2 at the diffusion layer and the gate layer are mirror images of each other with respect to the cell boundary line.

In the present embodiment, each of the channel regions 215A-F is in the shape of a single fin (or semiconductor fin). Thus, each of the transistors in the write port (including W_PU-1, W_PU-2, W_PD-1, W_PD-2, W_PG-1, and W_PG-2) is a FinFET formed on a single fin, and each of the transistors in the read port (including R_PD and R_PG) is a FinFET formed on two fins. Having more fins in the read port transistors increases the speed of the read port. In another embodiment (not shown), each of the transistors in the write port is a FinFET transistor formed on a single fin, and each of the transistors in the read port is a FinFET transistor formed on more than 2 fins. In yet another embodiment (not shown), each of the NMOSFET transistors (W_PD-1, W_PD-2, W_PG-1, W_PG-2, R_PD, and R_PG) is a FinFET formed on multiple (2 or more) fins, and each of the transistors in the read port (R_PD and R_PG) is formed on more fins than any of the transistors in the write port (W_PD-1, W_PD-2, W_PG-1, W_PG-2, W_PU-1, and W_PU-2). For example, each of R_PD and R_PG may be formed on 3 or more fins; each of W_PD-1, W_PD-2, W_PG-1, and W_PG-2 may be formed on 2 fins; and each of W_PU-1 and W_PU-2 may be formed on a single fin. These embodiments provide the write port with lower Vcc_min for improving cell stability and provide high on current (Ion) at the read port for fast read speed. In an embodiment, the NMOSFET at the write port (W_PD-1, W_PD-2, W_PG-1, and W_PG-2) are formed with first type work-function metal layers, and the NMOSFET at the read port (R_PD and R_PG) are formed with second type work-function metal layers, where the NMOSFET at the read port have lower threshold voltage (Vt) than the NMOSFET at the write port. This enables fast read operations.

FIG. 2-2 shows the layout of the SRAM cells 104 at the contact/via0 layer (via0 refers to vias landed on source/drain contacts, it is considered a level-0 via). To show the connectivity between the diffusion/gate layers and the contact/via0 layer, the active regions 205 and the gate stacks 240 are kept in FIG. 2-2. Referring to FIG. 2-2, the SRAM cells 104 further include source/drain contacts 262 disposed over the source/drain regions of the active regions 205 (the source/drain regions are disposed on both sides of the respective channel region). The SRAM cells 104 further include butted contacts (Butt_Co) 409 disposed over and connecting some active regions and the gate stacks. For example, in each cell 104, a butted contact 409 connects the active region 205D and the gate stack 240D, another butted contact 409 connects the active region 205E and the gate stack 240A. The SRAM cells 104 further include source/drain contact vias ("V0") 264 disposed over and connecting to the source/drain contacts, and gate vias ("VG") 242 disposed over and connecting to some of the gate stacks of each cell. Particularly, a source/drain contact 262F straddles between Cell-1 and Cell-2 and connects the source/drain region of the active regions 205F in Cell-1 and Cell-2. A source/drain contact via 264F is disposed on the source/drain contact 262F. Further, a gate via 242B is disposed on the gate stack 240B, a gate via 242C is disposed on the gate stack 240C, and a gate via 242E is disposed on the gate stack 240E. In the present embodiment, the layout of Cell-1 and Cell-2 at the contact/via0 layer are mirror images of each other, except the source/drain contact via 264F and the gate via 242E. In various embodiment, the source/drain contact via 264F may be placed in Cell-1 or in Cell-2, and the gate via 242E may be placed in Cell-1 or in Cell-2.

FIG. 2-3 shows the layout of the SRAM cells 104 at the M1 layer. To show the connectivity between the contact/via0 layer and the M1 layer, the source/drain contacts 262, the gate vias 242, and the source/drain contact vias 264 are kept in FIG. 2-3. Referring to FIG. 2-3, the SRAM cells 104 further include various conductors at the M1 layer and each conductor is oriented lengthwise along the "y" direction. These conductors in Cell-1 include, from right to left, a read bit line (R_BL) conductor, a second Vss conductor, a second W_WL landing pad, a write bit line bar (W_BLB) conductor, a first Vdd conductor, and a write bit line (W_BL) conductor. The Cell-2 includes, from left to right, a read bit line (R_BL) conductor, a second Vss conductor, a second W_WL landing pad, a write bit line bar (W_BLB) conductor, a first Vdd conductor, a write bit line (W_BL) conductor. These conductors in Cell-1 and in Cell-2 form mirror images with respect to the cell boundary line. The second Vss conductor is placed between the R_BL conductor and the second W_WL landing pad in each cell. The second W_WL landing pads are within each cell and are connected to the gate stacks 240C through gate vias (VG) 242C. The layout of the SRAM cells 104 further includes a read word line (R_WL) landing pad on a boundary line that is between a read port of a Cell-1 and a read port (not shown) of a Cell-2. The R_WL landing pads are connected to the gate stacks 240B through gate vias (VG) 242B. In the present embodiment, the write bit line conductors W_BL and W_BLB are wider than the read bit line conductor R_BL for improving V_min performance at the write port.

Still referring to FIG. 2-3, the layout of the SRAM cells 104 further includes a shared Vss conductor and a shared write word line (W_WL) landing pad. The shared Vss conductor and the shared W_WL landing pad are placed between the W_BL of the Cell-1 and the W_BL of the Cell-2. In the present embodiment, the shared Vss conductor is placed in Cell-1, specifically the write port of Cell-1, and the shared W_WL landing pad is placed in Cell-2, specifically the write port of Cell-2. Thus, the Cell-1 has two Vss conductors and only one W_WL landing pad, while the Cell-2 has two W_WL landing pads and only one Vss conductor. In an alternative embodiment, the locations for the shared Vss conductor and the shared W_WL landing pad are switched, where the shared Vss conductor is placed in Cell-2 and the shared W_WL landing pad is placed in Cell-1. The W_WL landing pads (including the shared W_WL landing pad) are within each cell. The W_WL landing pads and the R_WL landing pads are shorter than the width of the cell along the "y" direction. Other conductors are longer than the width of the cell along the "y" direction. The shared W_WL landing pad is connected to the gate via 242E which is in turn connected to the gate stack 240E (FIG. 2-2). Effectively, the shared W_WL landing pad is connected to the gate stack 240E through the gate via 242E. The shared Vss conductor is connected to the source/drain contact via 264F, which is in turn connected to the shared source/drain contact 262F. Effectively, the shared Vss conductor is connected to the shared source/drain contact 262F through the source/drain contact via 264F. By using the shared W_WL landing pad and the shared Vss conductor, the layout of the SRAM cells 104 at the M1 layer becomes less congested than the alternative where each cell 104 has two W_WL landing pads and two Vss conductors. Thus, with the present embodiment, the conductors at the M1 layer can be made wider (along the "x" direction) to reduce resistance and/or can be placed further apart from each other to reduce coupling capacitance. Either reduced resistance or reduced coupling capacitance contributes to improved performance of the SRAM cells 104. For example, the Vss conductors can be made wider at the M1 layer to reduce the resistance thereof and to reduce IR drop concerns. For another example, the bit lines in the write port can be made wider to reduce IR drop during write cycles, which benefits the V_min of the write port.

FIG. 3 shows a layout of the SRAM macro 102, particularly, a layout of certain layers (or features) of the TP SRAM cells 104 according to another embodiment where the cells 104 include GAA transistors. FIGS. 3-1, 3-2, and 3-3 show different layers of the layout of FIG. 3 for clarity purposes. The following discussion may refer to FIGS. 3, 3-1, 3-2, and 3-3 collectively. Many aspects of the layout in FIG. 3 are the same as those of the layout in FIG. 2, which will not be repeated. Some of the differences are discussed below.

FIG. 3-1 shows the layout of the SRAM cells 104 at the diffusion layer and the gate layer. Referring to FIG. 3-1, each cell 104 includes active regions 205 (including 205A, 205C, 205D, 205E, and 205F) that are oriented lengthwise along the "y" direction, and gate stacks 240 (including 240A, 240B, 240C, 240D, and 240E) that are oriented lengthwise along the "x" direction perpendicular to the "y" direction. The placement of the active regions 205C, 205D, and 205E in FIG. 3 is similar to the placement the active regions 205C, 205D, and 205E in FIG. 2. The active region 205A in FIG. 3 is effectively the sum of the active regions 205A and 205B in FIG. 2. The active regions 205D and 205E are disposed over an n-type well (or N Well) 204N. The active regions 205A, 205C, and 205F are disposed over p-type wells (or P Wells) 204P that are on both sides of the N well 204N along the "x" direction. The gate stacks 240 engage the channel layers 215 of the respective active regions 205 to form the transistors R_PD, R_PG, W_PD-2, W_PG-2, W_PU-2, W_PU-1, W_PG-1, and W_PD-1 in the same fashion as discussed with reference to FIG. 2-1, except that the transistors in FIG. 3-1 are GAA transistors while the transistors in FIG. 2-1 are FinFET. Note that not all channel layers 215 are labeled in FIG. 3-1 for simplicity purposes. In the present embodiment, the active region(s) of the read port (e.g., 205A) and the associated channel layer 215 are wider than those active regions of the write port (e.g., 205C, 205D, 205E, and 205F) and their associated channel regions. In an embodiment, within the write port, the active regions for the NMOSFET (e.g., 205F and 205C) and the associated channel region are wider than the active regions for the PMOSFET (e.g., 205D and 205E) and the associated channel region. These embodiments provide the write port with lower Vcc_min for improving cell stability and provide high on current (Ion) at the read port for fast read speed. In an embodiment, the NMOSFET at the write port (W_PD-1, W_PD-2, W_PG-1, and W_PG-2) are formed with first type work-function metal layers, and the NMOSFET at the read port (R_PD and R_PG) are formed with second type work-function metal layers, where the NMOSFET at the read port have lower threshold voltage (Vt) than the NMOSFET at the write port. This enables fast read operations.

FIG. 3-2 shows the layout of the SRAM cells 104 at the contact/via0 layer. To show the connectivity between the diffusion/gate layers and the contact/via0 layer, the active regions 205 and the gate stacks 240 of FIG. 3-1 are kept in FIG. 3-2. Referring to FIG. 3-2, the SRAM cells 104 further include source/drain contacts 262 disposed over the source/drain regions of the active regions 205 (the source/drain regions are disposed on both sides of the respective channel region), butted contacts (Butt_Co) 409 disposed over and connecting some active regions and the gate stacks, source/drain contact vias ("V0") 264 disposed over and connecting to the source/drain contacts, and gate vias ("VG") 242 disposed over and connecting to some of the gate stacks. In each cell 104, a butted contact 409 connects the active region 205D and the gate stack 240D, and another butted contact 409 connects the active region 205E and the gate stack 240A. A source/drain contact 262F straddles between Cell-1 and Cell-2 and connects the source/drain region of the active regions 205F in Cell-1 and Cell-2. A source/drain contact via 264F is disposed on the source/drain contact 262F. Further, a gate via 242E is disposed on the gate stack 240E. In the present embodiment, the layout of Cell-1 and Cell-2 at the contact/via0 layer are mirror images of each other, except the source/drain contact via 264F and the gate via 242E. In various embodiment, the source/drain contact via 264F may be placed in Cell-1 or in Cell-2, and the gate via 242E may be placed in Cell-1 or in Cell-2.

FIG. 3-3 shows the layout of the SRAM cells 104 at the M1 layer, which is the same as FIG. 2-3. The description with reference to FIG. 2-3 is incorporated herein for FIG. 3-3.

FIGS. 4-1, 4-2, and 4-3 show different layers of a layout of 8 SRAM cells 104 arranged into a 2×4 array (2 rows and 4 columns) according to an embodiment. Each SRAM cell 104 is also referred to as an SRAM unit cell and is shown as a dashed box.

Figures 1, 4:
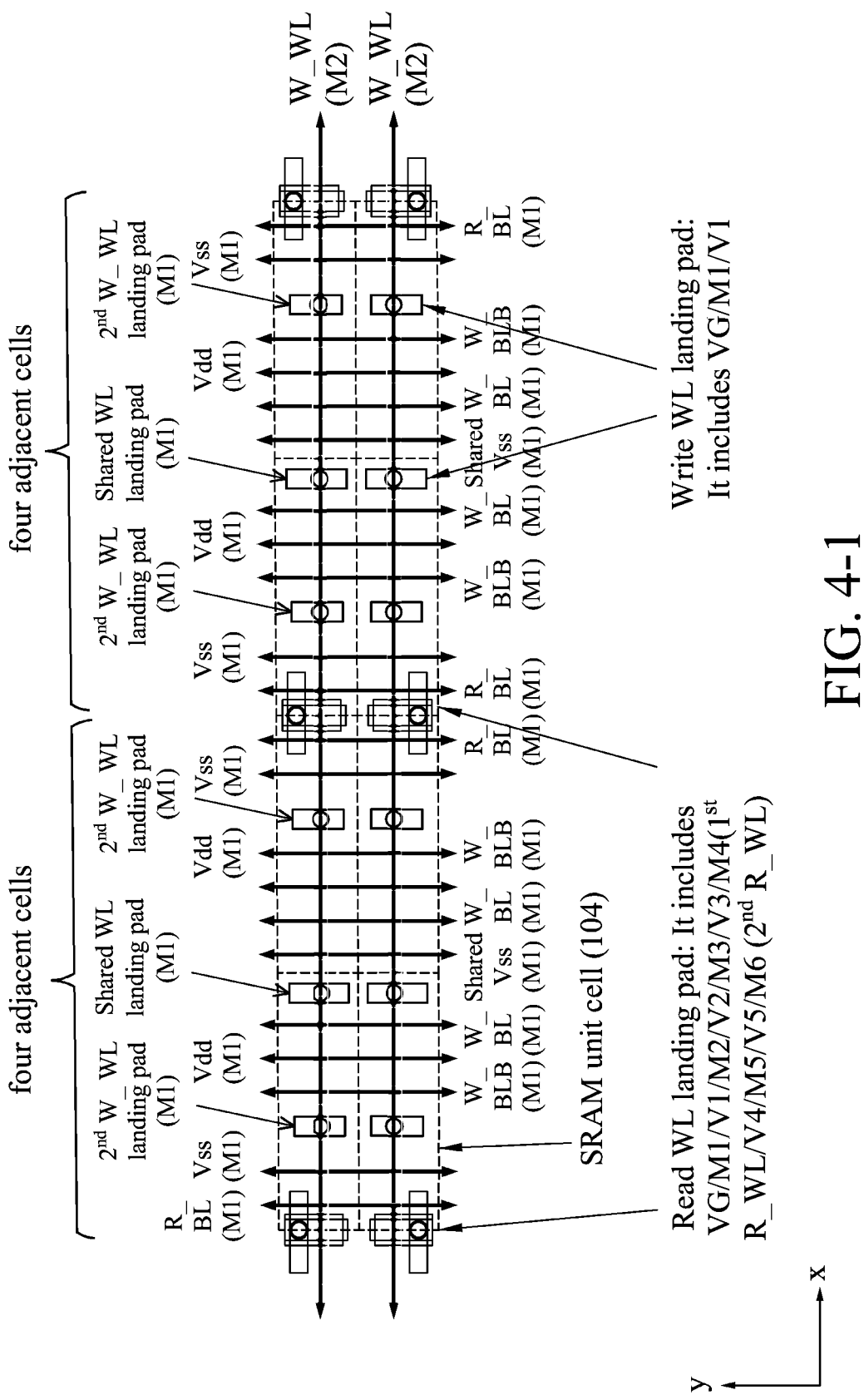
Figures 2, 4:
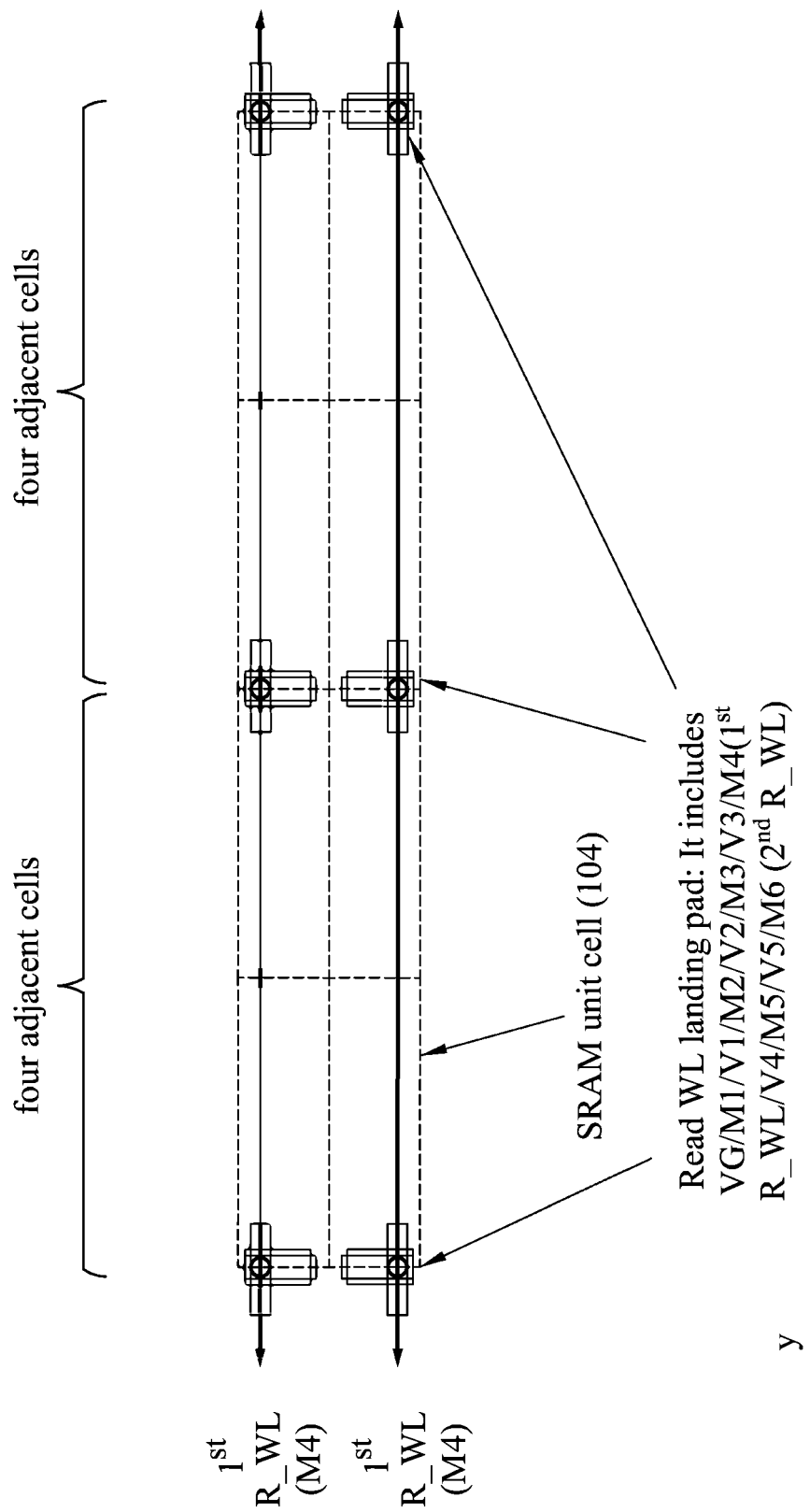
Figures 3, 4:
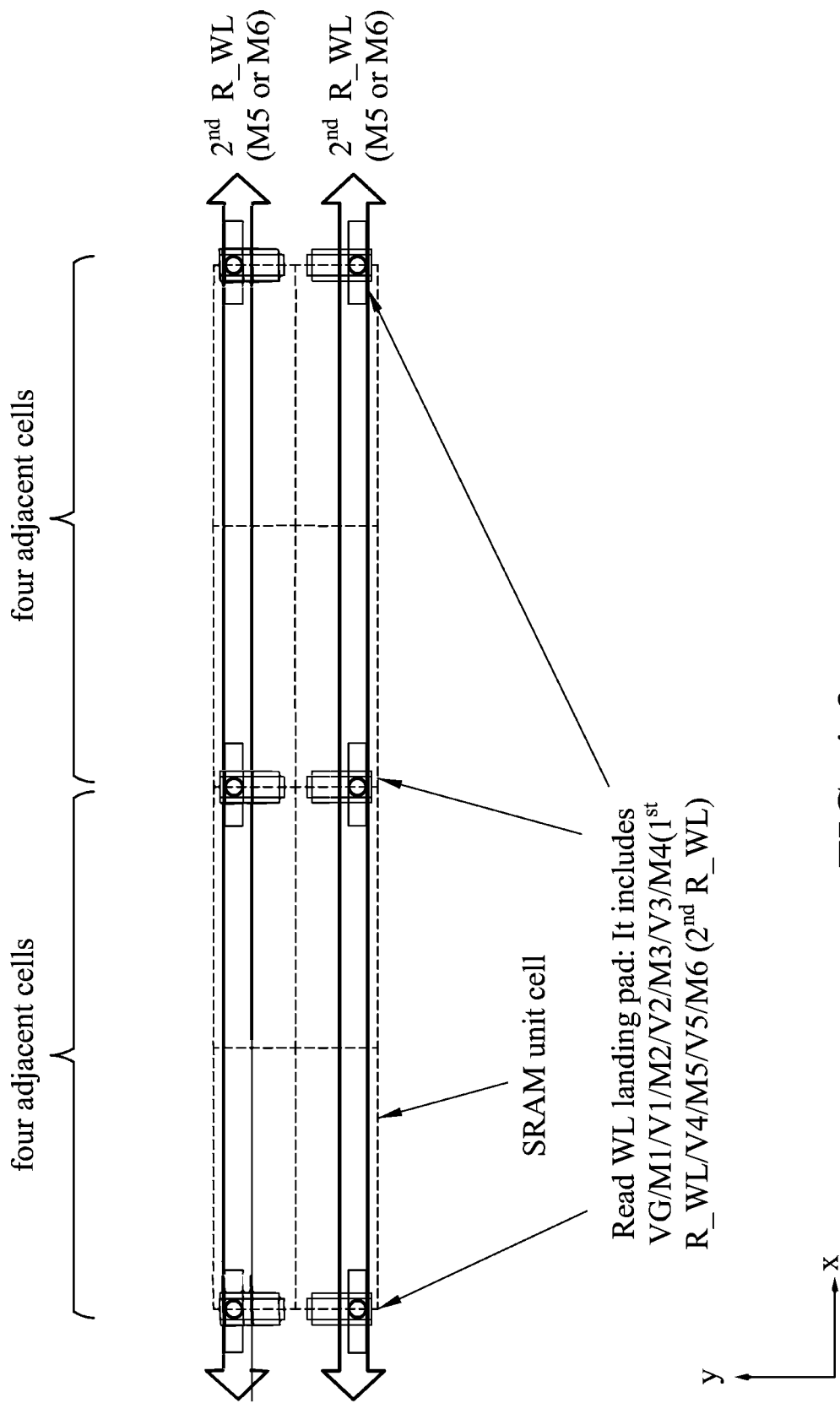

FIG. 4-1 shows the layout at the M1 layer (the first metal layer above the via0 layer) and at the M2 layer (the second metal layer which is immediately above the first metal layer). As shown in FIG. 4-1, at the M1 layer, the conductors are oriented lengthwise along the "y" direction. The conductors include, for each SRAM unit cell, a read bit line (R_BL) conductor, a Vss conductor, a $2^{nd}$ write word line (W_WL) landing pad, a Vdd conductor, and a write bit line (W_BL) conductor. These conductors are arranged into mirror image between two adjacent cells in the same row. In one of the two adjacent cells (for example, the cell at the lower right corner), it further includes a shared Vss conductor, and the other one of the two adjacent cells (for example, the cell immediately to the left of the cell at the lower right corner) includes a shared W_WL landing pad. The W_WL landing pads (including the shared W_WL landing pads) are located within a cell. The R_WL landing pads at the M1 layer (see FIGS. 2-3 and 3-3) are at the boundary of cells at an interval that is every 2 cells along the "x" direction. The Vss conductors (including the shared Vss conductors), Vdd conductors, and bit line (R_BL, W_BL, W_BLB) conductors extend (along the "y" direction) across multiple cells in the same column. For every two adjacent cells, there are three Vss conductors for power connection. The shared Vss conductor and the shared W_WL landing pad are placed between the Cell-1's W_BL conductor and the Cell-2's W_BL conductor.

The write word line (W_WL) conductors are located at the M2 layer (or above in some embodiments) and are oriented lengthwise along the "x" direction. The W_WL conductors extend across multiple cells in the same row. The W_WL conductors are vertically (into the page of FIG. 4-1) connected to the W_WL landing pads of each cell and the shared W_WL landing pads. The layout further includes read word line (R_WL) landing pads located at the M2 layer. The R_WL landing pads at the M2 layer are vertically connected to the R_WL landing pads at the M1 layer (see FIGS. 2-3 and 3-3) through vias at via1 layer (or level-1 via) (see FIG. 10). The R_WL landing pads at the M1 layer are in turn connected to the gate stacks 240B through gate vias (VG) 242B (see FIGS. 2-2 and 3-2). The layout further includes read word line (R_WL) landing pads located at the M3 layer, which are vertically connected to the R_WL landing pads at the M2 layer through vias at via2 layer (or level-2 via) (see FIG. 10). Although not shown, Vss conductors also exist in the M2 layer and are oriented lengthwise along the "x" direction. The Vss conductors in the M2 layer are referred to as M2 Vss power mesh lines. They are connected to the Vss conductors (including the shared Vss conductors) in the M1 layer. In some embodiment, every two, four, or eight cells 104 may share one M2 Vss power mesh line. This reduces the total number of M2 Vss power mesh lines, leaving more room for the write word line (W_WL) conductors at the M2 layer. For example, the W_WL conductors can be made wider to reduce resistance or can be spaced out farther apart from each other to reduce coupling capacitance. The conductors at the M1 and the M2 layers are all line shapes, which are lithography patterning friendly and allow spacer lithography implementation and patterning process margin improvement.

FIG. 4-2 shows read word line (R_WL) conductors at the M4 layer oriented lengthwise along the "x" direction. The R_WL conductors at the M4 layer are vertically connected to the R_WL landing pads at the M3 layer through vias at via3 layer (or level-3 via) (see FIG. 10).

FIG. 4-3 shows read word line (R_WL) conductors at the M5 or M6 layer oriented lengthwise along the "x" direction. The R_WL conductors at the M5 layer are vertically connected to the R_WL conductors at the M4 layer through vias at via4 layer (or level-4 via) (see FIG. 10). The R_WL conductors at the M6 layer are vertically connected to the R_WL conductors at the M5 layer, if any, through vias at via5 layer (or level-5 via) (see FIG. 10), or connected to the R_WL conductors at the M4 layer through vias at via4 and via5 layers (see FIG. 10). In an embodiment, the W_WL conductors are only at a single metal layer (e.g., the M2 layer) while the R_WL conductors are in at least two metal layers (e.g., the M4 layer and the M5 or M6 layer). This reduces the resistance in the R_WL conductors for fast read operations.

Figures 1, 5:
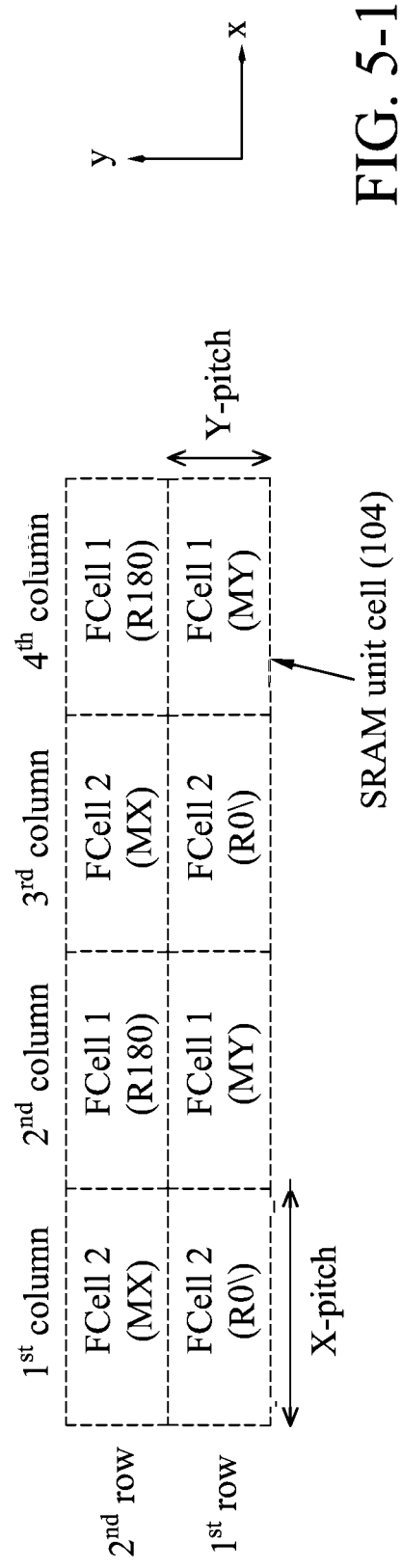
Figures 2, 5:
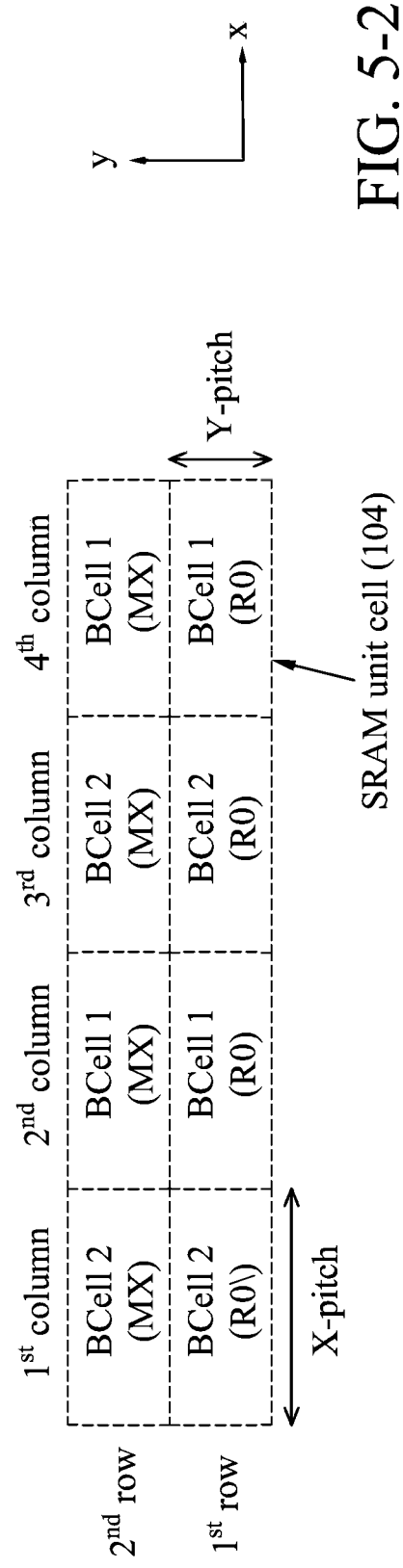

FIGS. 5-1 and 5-2 show the arrangement of cells 104 in a 2×4 array (two rows and four columns) according to an embodiment. FIG. 5-1 shows the arrangement of cells 104 at the front-end-of-line (FEOL) and the mid-end-of-line (MEOL) layers and each cell is labeled as FCell (FEOL/MEOL portion of the cell). FIG. 5-2 shows the arrangement of cells 104 at the back-end-of-line (BEOL) layers and each cell is labeled as BCell (BEOL portion of the cell). In the present embodiment, the FEOL and MEOL refer to the layers below the first metal layer (the M1 layer), including the diffusion layer, the gate layer, the contact layer, the gate via layer, and the via0 layer (or level-0 via layer) (i.e., vias on contacts) (see FIG. 10). Further, the BEOL refer to the layers at the M1 layer and above. Further as shown in FIGS. 5-1 and 5-2, the array of cells includes two different cells, "Cell 1" and "Cell 2" which are the same as the Cell-1 and Cell-2 in FIG. 2 or FIG. 3, respectively, in an embodiment. The "FCell 1" refers to the FEOL/MEOL portion of Cell 1, "FCell 2" refers to the FEOL/MEOL portion of Cell 2, "BCell 1" refers to the BEOL portion of Cell 1, and "BCell 2" refers to the BEOL portion of Cell 2. Each cell 104 has a dimension "X-pitch" along the "x" direction and a dimension "Y-pitch" along the "y" direction. In an embodiment, the ratio of X-pitch to Y-pitch is in a range of 3.5 to 6, which makes the layout of a single cell a "thin style" cell.

Referring to FIG. 5-1, an FCell 1 and an adjacent FCell 2 share a boundary along the "y" direction, and the layout of the FCell 1 and the FCell 2 are mirror image of each other with respect to their boundary. For example, if the layout of FCell 2 at the $1^{st}$ row and the $3^{rd}$ column is taken as a reference layout (R0), then the layout of FCell 1 at the $1^{st}$ row and the $4^{th}$ column is a mirror of R0 with respect to the boundary along the "y" direction (denoted as MY). Further, the layout of two adjacent FCell 2 are mirror image of each other with respect to a boundary between them along the "x" direction. Thus, the layout of FCell 2 at the $2^{nd}$ row and the $3^{rd}$ column is a mirror of R0 with respect to the boundary along the "x" direction (denoted as MX). Along the same logic, the layout of FCell 1 at the $2^{nd}$ row and the $4^{th}$ column is a 180-degree rotation of R0 (denoted as R180).

Referring to FIG. 5-2, a BCell 1 and an adjacent BCell 2 share a boundary along the "y" direction. However, the layout of the BCell 1 and the BCell 2 are not mirror image of each other. In an embodiment, the layout of the BCell 1 has one extra Vss conductor at the M1 layer than the layout of the BCell 2, and the layout of the BCell 2 has one extra W_WL landing pad at the M1 layer than the layout of the BCell 1. In an embodiment, other than the extra Vss conductor and the extra W_WL landing pad, the layout of the BCell 1 and the BCell 2 are mirror image of each other with respect to their boundary along the "y" direction. However, the layout of two adjacent BCell 1 are mirror image of each other with respect to a boundary between them along the "x" direction (denoted as MX), and the layout of two adjacent BCell 2 are mirror image of each other with respect to a boundary between them along the "x" direction.

Figure 6:
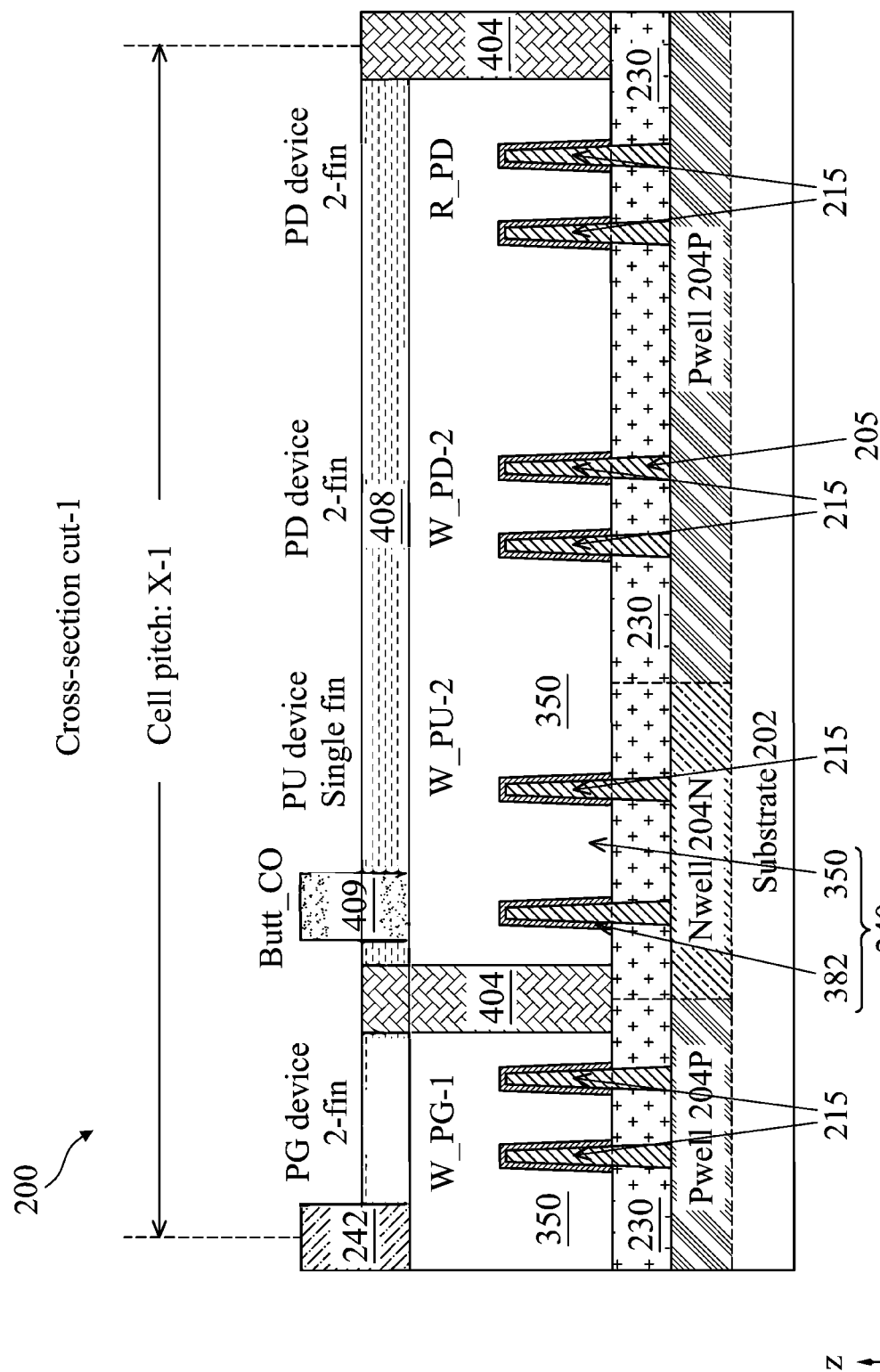
FIG. 6 shows a cross-sectional view of the memory array of FIG. 2, in portion, along the "Cut-1" line in FIG. 2, in accordance with some embodiments of the present disclosure.
Figure 7:
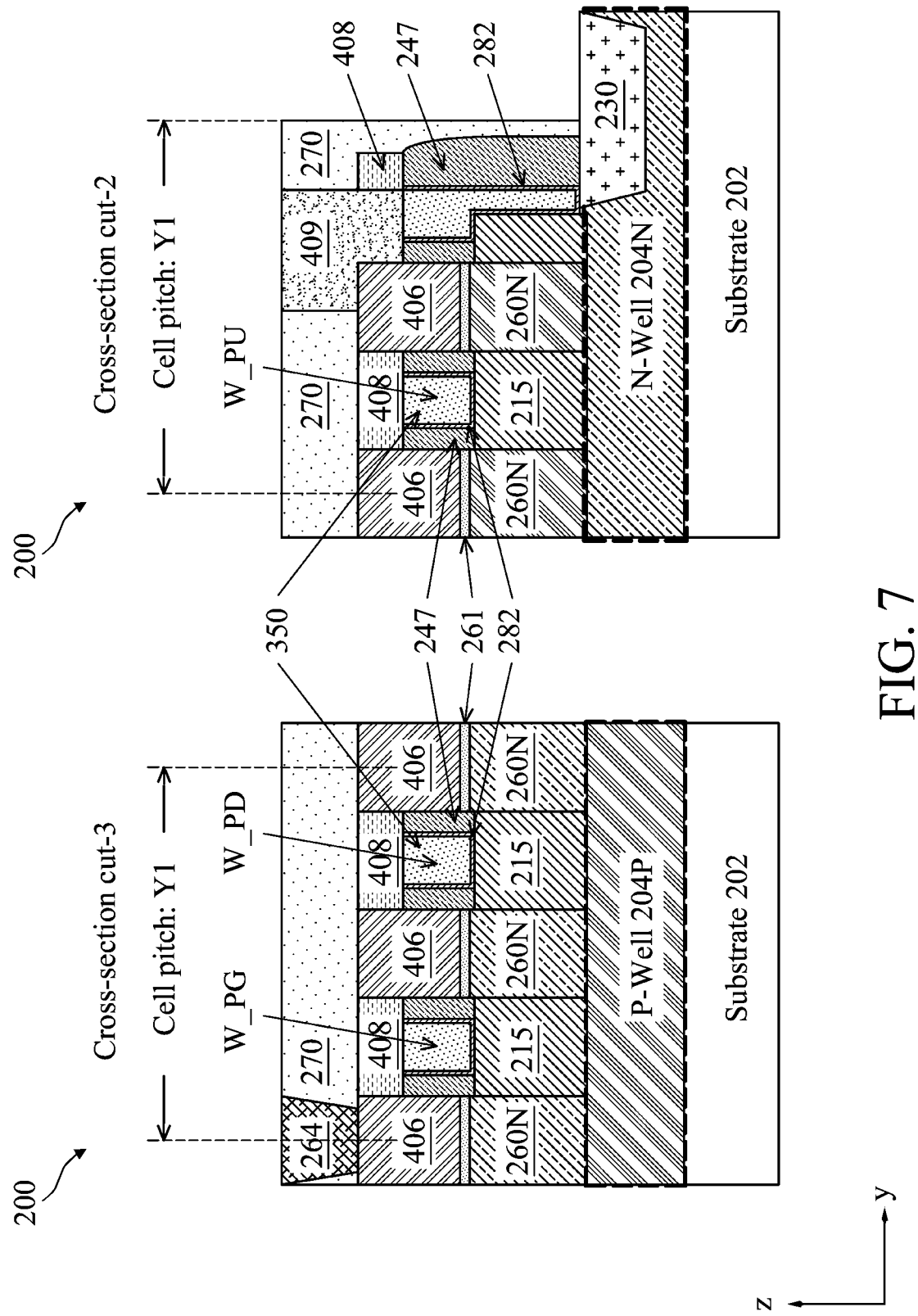
FIG. 7 shows two cross-sectional views of the memory array of FIG. 2, in portion, along the "Cut-2" line and the "Cut-3" line in FIG. 2, respectively, in accordance with some embodiments of the present disclosure.

FIGS. 6 and 7 illustrate cross-sectional views of the SRAM cells 104 according to an embodiment where the transistors in the cells 104 are FinFETs. These views may be taken along the "Cut-1," "Cut-2," and "Cut-3" lines in FIG. 2. However, there is a slight difference between the embodiment shown in FIGS. 6-7 and that in FIG. 2. In the embodiment shown in FIG. 2, each NMOSFEF in the write port (i.e., W_PD-1, W_PG-1, W_PD-2, and W_PG-2) is shown to have a single fin (or is formed on a single fin). In the embodiment shown in FIG. 6-7, each NMOSFEF in the write port (i.e., W_PD-1, W_PG-1, W_PD-2, and W_PG-2) is shown to have two fins (or is formed on two fins). Other aspects of the two embodiments are the same.

Referring to FIGS. 2, 6, and 7 collectively (and taking into account the difference identified above), in the depicted embodiment, the active regions 205 include fin-shaped channel layers 215 (or semiconductor fins 215 or fins 215) in the respective channel regions, and source/drain feature 260 (including 260P for PMOSFET and 260N for NMOSFET) in the source/drain regions that sandwich the channel regions. The channels 215 refer to the portions of the active region 205 that are engaged by the gate stacks 240.

The device 200 includes a substrate 202, over which the various features including the wells 204P/N, the gate stacks 240, and the active regions 205 are formed. In an embodiment, substrate 202 includes silicon, such as a silicon wafer. Alternatively, or additionally, substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

The wells 204P and 204N are formed in or on the substrate 202. In the present embodiment, the wells 204P are p-type doped regions configured for n-type transistors, and the wells 204N are n-type doped regions configured for p-type transistors. The wells 204N are doped with n-type dopants, such as phosphorus, arsenic, other n-type dopant, or combinations thereof. The wells 204P are doped with p-type dopants, such as boron, indium, other p-type dopant, or combinations thereof. In some implementations, substrate 202 includes doped regions formed with a combination of p-type dopants and n-type dopants. The various wells can be formed directly on and/or in substrate 202. An ion implantation process, a diffusion process, and/or other suitable doping process can be performed to form the various wells.

As shown in FIGS. 6-7, the device 200 further includes an isolation structure (or isolation features) 230 over the substrate 202 and isolating the adjacent active regions 205. The isolation structure 230 may include silicon oxide, silicon nitride, silicon oxynitride, other suitable isolation material (for example, including silicon, oxygen, nitrogen, carbon, or other suitable isolation constituent), or combinations thereof. The isolation structure 230 may include different structures, such as shallow trench isolation (STI) structures, deep trench isolation (DTI) structures, and/or local oxidation of silicon (LOCOS) structures.

As shown in FIG. 7, the channel layers 215 are disposed over the wells 204P and 204N and connecting a pair of source/drain features 260, such as a pair of n-type source/drain features 260N for NMOSFET (or n-type FinFET) or a pair of p-type source/drain features 260P for PMOSFET (or p-type FinFET). In an embodiment, the channel layers 215 for NMOSFET include single crystalline silicon or intrinsic silicon or another suitable semiconductor material; and the channel layers 215 for PMOSFET may comprise silicon, germanium, silicon germanium, or another suitable semiconductor material.

The source/drain features 260P and 260N may be formed using epitaxial growth. For example, a semiconductor material is epitaxially grown from portions of substrate 202 and the respective channel layers 215, forming epitaxial source/drain features 260P and 260N. In some embodiments, the epitaxial source/drain features 260N may include silicon and may be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, the epitaxial source/drain features 260P may include silicon germanium or germanium and may be doped with boron, other p-type dopant, or combinations thereof (for example, forming Si:Ge:B epitaxial source/drain features). The epitaxial source/drain features 260P and 260N may be doped in-situ or ex-situ. In some embodiments, epitaxial source/drain features 260P and/or 260N include more than one epitaxial semiconductor layer, where the epitaxial semiconductor layers can include the same or different materials and/or dopant concentrations.

Each gate stack 240 includes a gate electrode layer 350 disposed over a gate dielectric layer 282. The gate electrode layer 350 and the gate dielectric layer 282 engages the top and sidewalls of each channel layer 215. In some further embodiments, the gate stack 240 further includes an interfacial layer (such as having silicon dioxide, silicon oxynitride, or other suitable materials) between the gate dielectric layer 282 and the channel layers 215. The gate dielectric layer 282 may include a high-k dielectric material such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). The gate dielectric layer 282 may be formed by chemical oxidation, thermal oxidation, atomic layer deposition (ALD), chemical vapor deposition (CVD), and/or other suitable methods. In some embodiments, the gate electrode layer 350 includes an n-type work function layer for NMOSFET device or a p-type work function layer for PMOSFET device and further includes a metal fill layer disposed over the work function layer. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. For example, a metal fill layer may include aluminum, tungsten, cobalt, copper, and/or other suitable materials. The gate electrode layer 350 may be formed by CVD, PVD, plating, and/or other suitable processes. Since the gate stack 240 includes a high-k dielectric layer and metal layer(s), it is also referred to as a high-k metal gate.

The device 200 includes gate spacers 247 on sidewalls of the gate stacks 240 and over the channel layers 215. The gate spacers 247 are formed by any suitable process and include a dielectric material such as silicon oxide, silicon nitride, silicon oxynitride (SiON), silicon carbide, silicon carbon nitride (SiCN), silicon oxycarbide (SiOC), silicon oxycarbon nitride (SiOCN), carbon doped oxide, nitrogen doped oxide, porous oxide, air gap, or a combination thereof. In some embodiments, gate spacers 247 include a multi-layer structure, such as a first dielectric layer that includes silicon nitride and a second dielectric layer that includes silicon oxide.

The device 200 further includes gate-end dielectric features 404 that are disposed between an end of a gate stack 240 and an end of another gate stack 240. In an embodiment, the gate-end dielectric features 404 include a high-k material, such as selected from a group consisting of $Si_3N_4$, nitrogen-containing oxide, carbon-containing oxide, dielectric metal oxide such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), hafnium dioxide-alumina ($HfO_2$—$Al_2O_3$) alloy, other suitable high-k dielectric material, or combinations thereof.

The device 200 further includes a gate-top dielectric layer 408 that is disposed over each of the gate stacks 240. The gate-top dielectric layer 408 may include a material selected from the group consisting of silicon oxide, SiOC, SiON, SiOCN, nitride base dielectric, dielectric metal oxide such as Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), or a combination thereof.

The device 200 further includes silicide features 261 over the source/drain features 260N and 260P, and source/drain (S/D) contacts 406 over the silicide features 261. The silicide features 261 may be formed by depositing one or more metals over the S/D features 260N/P, performing an annealing process to the device 200 to cause reaction between the one or more metals and the S/D features 260N/P to produce the silicide features 261, and removing un-reacted portions of the one or more metals. The silicide features 261 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds. In an embodiment, the S/D contacts 406 may include a conductive barrier layer and a metal fill layer over the conductive barrier layer. The conductive barrier layer functions to prevent metal materials of the metal fill layer from diffusing into the dielectric layers adjacent the S/D contacts 406. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), or other metals, and may be formed by CVD, PVD, ALD, plating, or other suitable processes. In some embodiments, the conductive barrier layer is omitted in the S/D contacts 406.

The device 200 further includes an inter-layer dielectric (ILD) layer 270. The ILD layer 270 is disposed over the isolation structure 230, the S/D features 260N/P, the S/D contacts 406, the gate stacks 240, the gate spacers 247, and the gate-top dielectric layer 408. In some embodiments, the device 200 further includes a contact etch stop layer (CESL) between the ILD layer 270 and the S/D features 260N/P, the gate stacks 240, and the top spacers 247. The CESL may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods. The ILD layer 270 may comprise tetraethylorthosilicate (TEOS) formed oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The ILD 270 may be formed by PECVD (plasma enhanced CVD), FCVD (flowable CVD), or other suitable methods.

The device 200 further includes butted contacts 409 that electrically connect the S/D contacts 406 to the respective gate stacks 240, gate vias "VG" 242, and source/drain contact vias "V0" 264. Each of the gate vias 242, S/D contact vias 264, and butted contacts 409 may include a conductive barrier layer and a metal fill layer over the conductive barrier layer. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), or other metals, and may be formed by CVD, PVD, ALD, plating, or other suitable processes.

Figure 8:
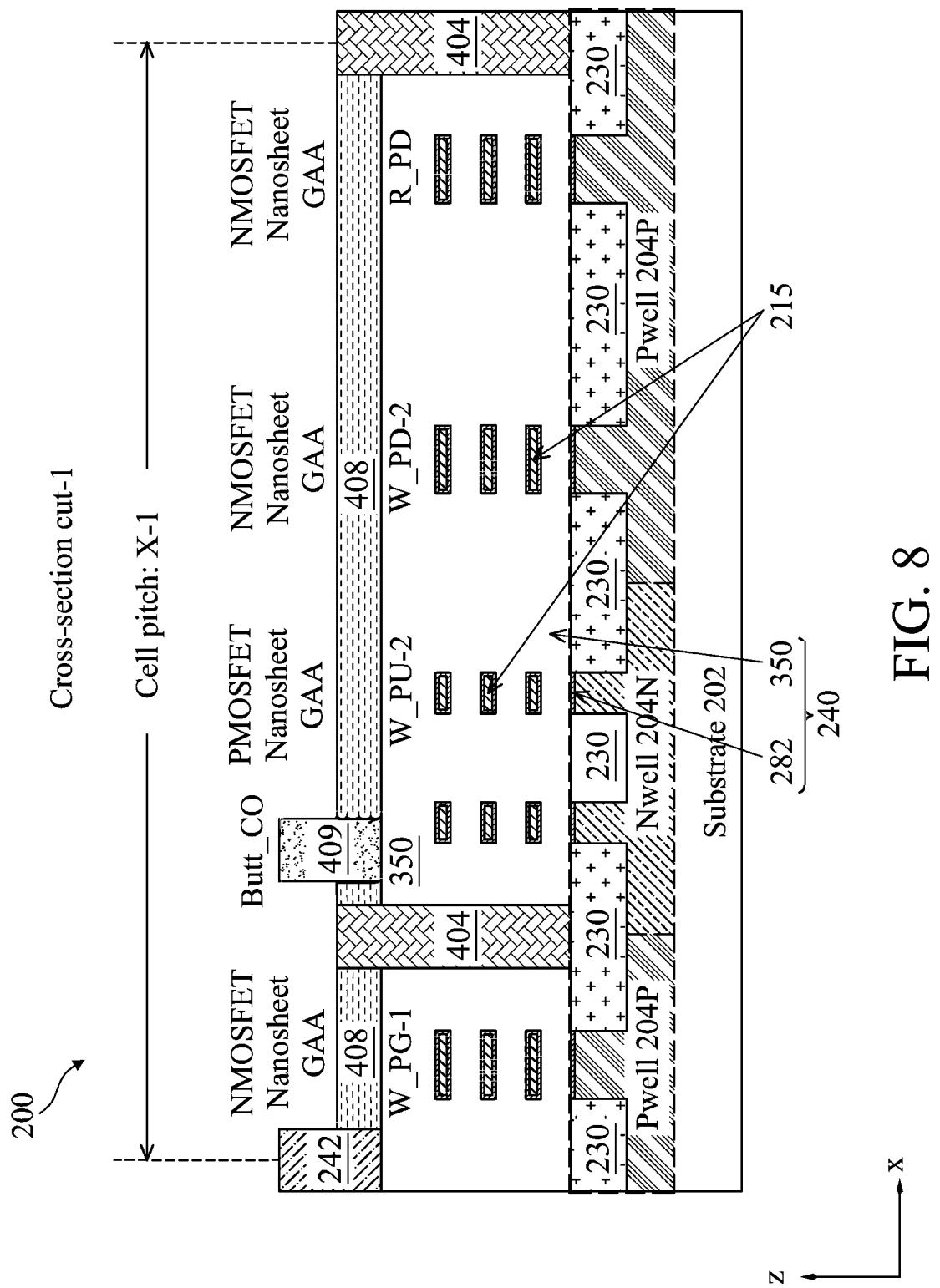
FIG. 8 shows a cross-sectional view of the memory array of FIG. 3, in portion, along the "Cut-1" line in FIG. 3, in accordance with some embodiments of the present disclosure.
Figure 9:
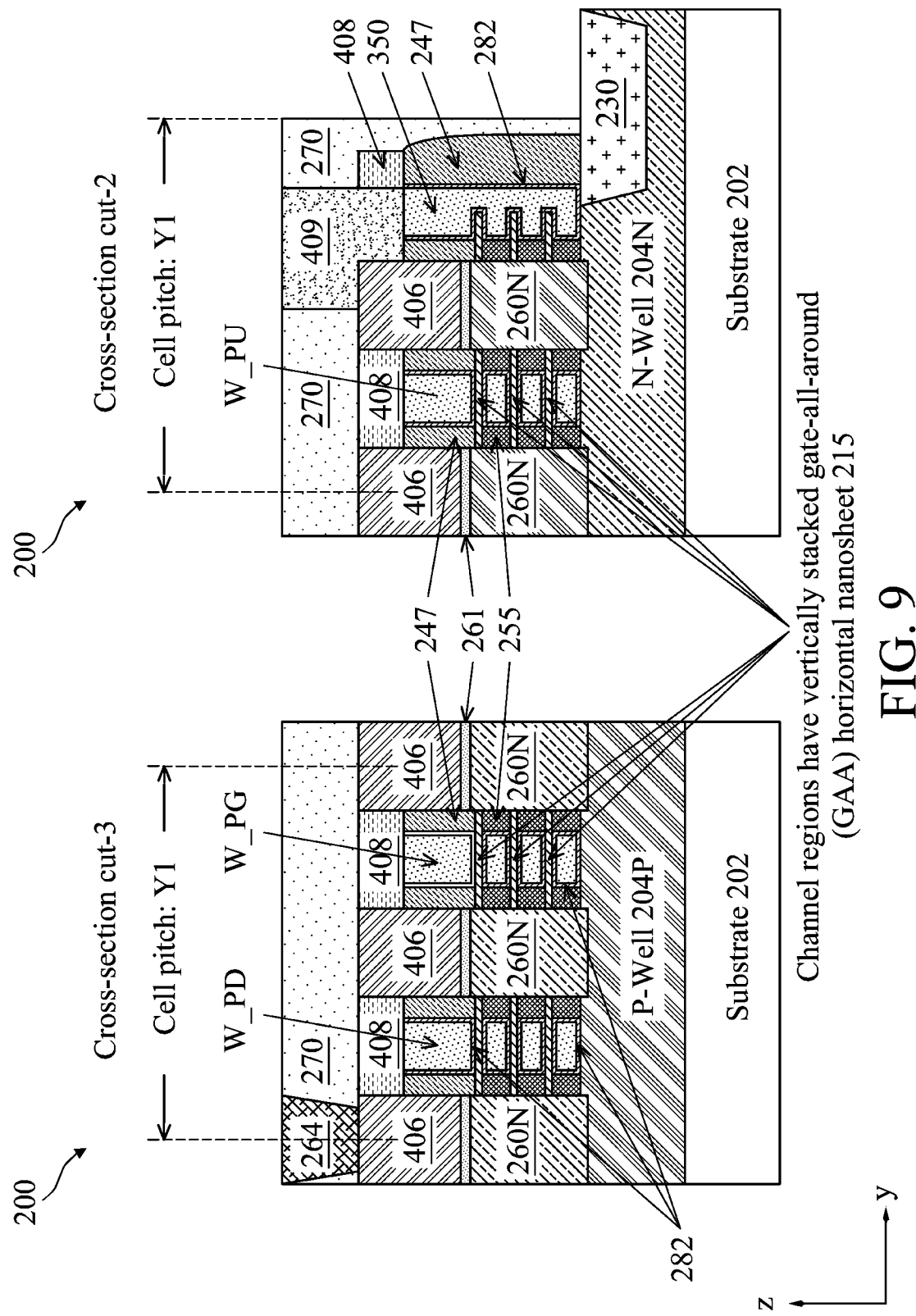
FIG. 9 shows two cross-sectional views of the memory array of FIG. 3, in portion, along the "Cut-2" line and the "Cut-3" line in FIG. 3, respectively, in accordance with some embodiments of the present disclosure.

FIGS. 8 and 9 illustrate cross-sectional views of the SRAM cells 104 according to an embodiment where the transistors in the cells 104 are GAA transistors. These views may be taken along the "Cut-1," "Cut-2," and "Cut-3" lines in FIG. 3. However, there is a slight difference between the embodiment shown in FIGS. 8-9 and that in FIG. 3. In the embodiment shown in FIG. 3, the active regions 205 of the NMOSFEF in the write port (i.e., W_PD-1, W_PG-1, W_PD-2, and W_PG-2) are narrower (along the "x" direction) than the active regions 205 of the NMOSFEF in the read port (i.e., R_PD and R_PG). In the embodiment shown in FIG. 8-9, the active regions 205 of the NMOSFEF in the write port (i.e., W_PD-1, W_PG-1, W_PD-2, and W_PG-2) have about the same width (along the "x" direction) as the active regions 205 of the NMOSFEF in the read port (i.e., R_PD and R_PG). Other aspects of the two embodiments are the same.

Referring to FIGS. 3, 8, and 9 collectively (and taking into account the difference identified above), many features of the device 200 in FIGS. 8-9 are the same as those in FIGS. 6-7, with the same reference numerals denoting the same features. For simplicity, the following discussion only focuses on some of the differences between the two embodiments.

In the present embodiment, the active regions 205 include horizontally oriented vertically stacked transistor channels 215 in the respective channel regions, and source/drain feature 260 (including 260P for PMOSFET and 260N for NMOSFET) in the source/drain regions that sandwich the channel regions. In the present embodiment, the width of the channels 215 for the pull-down and pass-gate devices (i.e., R_PD, R_PG, W_PD-1, W_PD-2, W_PG-1, and W_PG-2) is greater than the width of the channels 215 for the pull-up devices (i.e., W_PU-1 and W_PU-2).

As shown in FIGS. 8-9, the channel layers 215 are suspended over the wells 204N and 204P and connecting a pair of source/drain features 260N for NMOSFET or a pair of source/drain features 260P for PMOSFET. The channel layers 215 are stacked one over another along the "z" direction (which is the vertical direction or channel thickness direction), and each of the channel layers 215 is oriented lengthwise along the "y" direction and widthwise along the "x" direction (FIG. 3). The gate stacks 240 (including a gate dielectric layer 282 and a gate electrode layer 350) wrap around each of the channel layers 215, forming a gate-all-round (GAA) transistor. The channel layers 215 may include single crystalline silicon or intrinsic silicon. Alternatively, the channel layers 215 may comprise germanium, silicon germanium, or another suitable semiconductor material(s). Initially, the channel layers 215 are formed as part of a semiconductor layer stack that include the channel layers 215 and other semiconductor layers of a different material. During a gate replacement process, the semiconductor layer stack in the channel regions are selectively etched to remove the other semiconductor layers, leaving the channel layers 215 suspended over the substrate 202 and between the respective source/drain features 260P, 260N. This is also referred to as a channel release process.

As shown in FIG. 9, the device 200 further includes gate spacers 255 on sidewalls of the gate stack 240 and below the topmost channel layer 215. In the present disclosure, the gate spacers 247 are also referred to as outer spacers 247 or top spacers 247, and the gate spacers 255 are also referred to as inner spacers 255. The inner spacers 255 are disposed laterally between the source/drain features 260N (or 260P) and the gate stacks 240 and vertically between adjacent channel layers 215.

Figure 10:
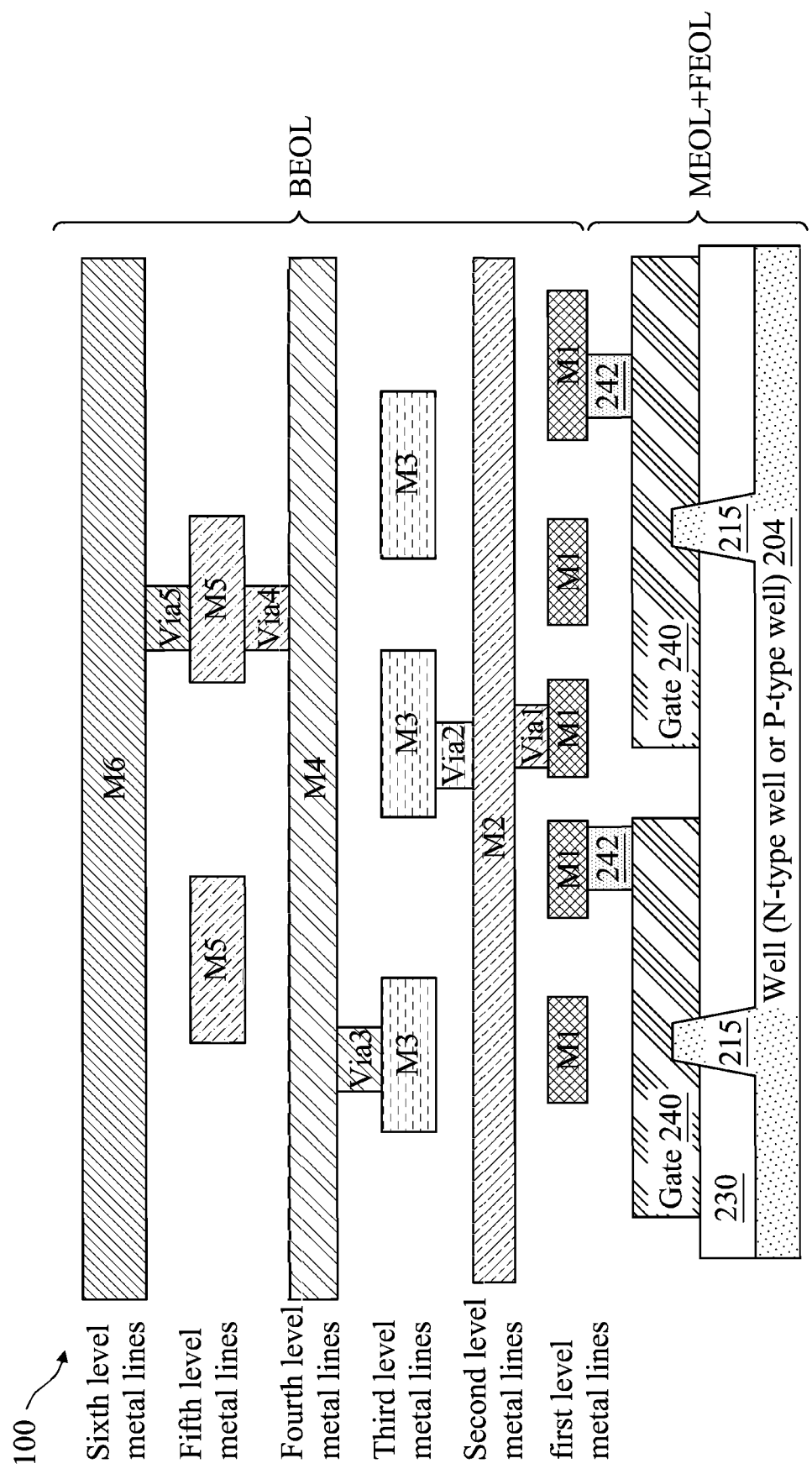
FIG. 10 shows a cross-sectional view of the memory array of FIG. 2, in portion, in accordance with some embodiments of the present disclosure.
Figure 11:
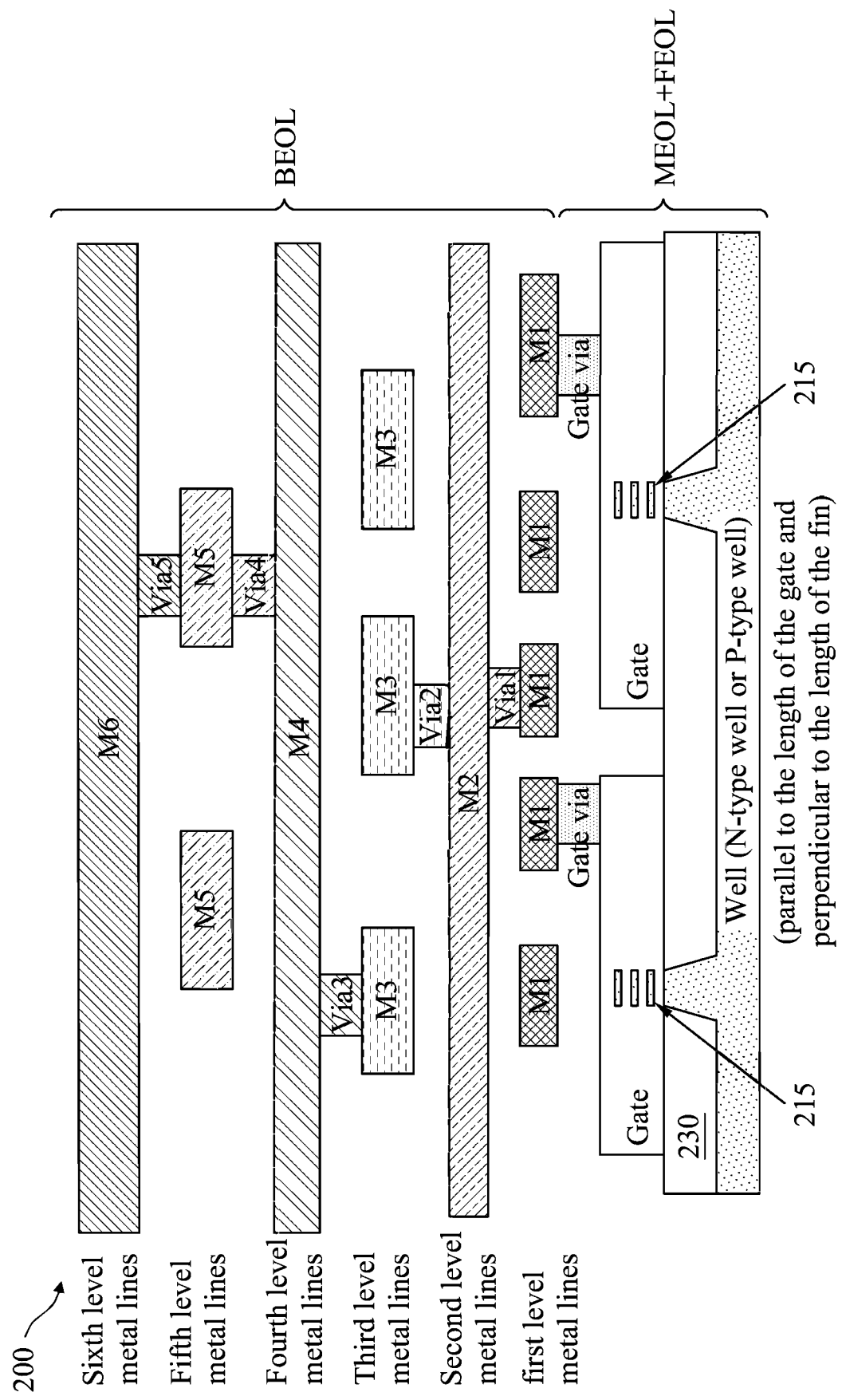
FIG. 11 shows a cross-sectional view of the memory array of FIG. 3, in portion, in accordance with some embodiments of the present disclosure.

FIGS. 10 and 11 shows cross-sectional views of the connectivity in the device 200 according to some embodiments. FIG. 10 shows the device 200 with FinFETs, and FIG. 11 shows the device 200 with GAA transistors. Otherwise, FIG. 10 is the same as FIG. 11. Referring to FIGS. 10 and 11 collectively, the device 200 includes the wells 204, channels 215, isolation structure 230, gate stacks 240, and gate vias 242 at the FEOL and MEOL portion. The device 200 further includes metal lines at the M1, M2, M3, M4, M5, M6, and other higher metal layers (not shown) and vias between adjacent metal layers at the BEOL portion. The vias are at via1, via2, via3, via4, via5, and higher via layers (not shown). The M1 layer is connected to gate stacks 240 through the gate vias 242. Even though not shown, the M1 layer is also connected to source/drain contacts at the MEOL through via0 264.

Although not intended to be limiting, one or more embodiments of the present disclosure provide many benefits to a semiconductor device and the formation thereof. For example, embodiments of the present disclosure provide designs and layouts for two port (TP) SRAM cells that have optimized routing at the M1 layer. For example, two adjacent TP SRAM cells are provided with asymmetric routings at the M1 layer where one of the cells has a shared Vss conductor and the other one of the cells has a shared W_WL landing pad. By sharing these conductors, the total number of conductors at the M1 layer for the two cells is reduced. Thus, the conductors at the M1 layer can be made wider to reduce resistance thereof or can be placed further apart to reduce coupling capacitance. Embodiments of the present disclosure can be implemented with FinFET or GAA transistors to achieve high device integration. The present embodiments can be readily integrated into existing CMOS fabrication processes.

In one example aspect, the present disclosure is directed to a semiconductor structure that includes a substrate and an array of two-port (TP) SRAM cells over the substrate. Each of the array of TP SRAM cells includes a write port and a read port. The write port includes first and second write pass gate (W_PG) transistors, first and second write pull-down (W_PD) transistors, and first and second write pull-up (W_PU) transistors. The read port includes a read pass gate (R_PG) transistor and a read pull-down (R_PD) transistor. The array of TP SRAM cells includes a first TP SRAM cell and a second TP SRAM cell. The write port of the first TP SRAM cell abuts the write port of the second TP SRAM cell. The first W_PG transistor of the first TP SRAM cell and the first W_PG transistor of the second TP SRAM cell share a common gate electrode. A source/drain electrode of the first W_PD transistor of the first TP SRAM cell and another source/drain electrode of the first W_PD transistor of the second TP SRAM cell share a common source/drain contact. The first TP SRAM cell includes a first Vss conductor that is connected to the common source/drain contact through a level-0 via. The second TP SRAM cell includes a first write word line (W_WL) landing pad that is connected to the common gate electrode through a gate via. The first Vss conductor and the first W_WL landing pad are located at a first metal (M1) layer.

In an embodiment of the semiconductor structure, each of the first and the second TP SRAM cells further includes a write bit line (W_BL) that is located at the M1 layer and connected to a source/drain electrode of the first W_PG transistor of the respective TP SRAM cell. In a further embodiment, the first W_WL landing pad is located between the W_BL of the second TP SRAM cell and the first Vss conductor, and the first Vss conductor is located between the W_BL of the first TP SRAM cell and the first W_WL landing pad.

In an embodiment of the semiconductor structure, each of the first and the second TP SRAM cells further includes a W_BLB conductor, a read bit line (R_BL) conductor, a second W_WL landing pad, a Vdd conductor, a second Vss conductor, and a read word line (R_WL) landing pad that are all located at the M1 layer. In a further embodiment, in each of the first and the second TP SRAM cells, the second Vss conductor is located between the R_BL and the second W_WL landing pad, and the R_WL landing pad is located at a boundary of the respective TP SRAM cell.

In another embodiment of the semiconductor structure, in each of the first and the second TP SRAM cells, each of the R_PG transistor and the R_PD transistor includes a FinFET formed with multiple semiconductor fins, and each of the first and second W_PG transistors, the first and second W_PD transistors, and the first and second W_PU transistors includes a FinFET formed with a single semiconductor fin.

In another embodiment of the semiconductor structure, in each of the first and the second TP SRAM cells, each of the R_PG transistor, the R_PD transistor, the first and second W_PG transistors, the first and second W_PD transistors, and the first and second W_PU transistors includes a FinFET formed with multiple semiconductor fins, wherein the R_PG and R_PD transistors are formed with more semiconductor fins than the first and second W_PG transistors, the first and second W_PD transistors, and the first and second W_PU transistors.

In another embodiment of the semiconductor structure, in each of the first and the second TP SRAM cells, each of the R_PG transistor, the R_PD transistor, the first and second W_PG transistors, the first and second W_PD transistors, and the first and second W_PU transistors includes a GAA transistor, wherein the R_PG transistor and the R_PD transistor have a wider transistor channel than the first and second W_PG transistors, the first and second W_PD transistors, and the first and second W_PU transistors.

In another embodiment of the semiconductor structure, each of the first and the second TP SRAM cells further includes a W_WL conductor, a read word line (R_WL) landing pad, and a Vss power mesh conductor that all located at a second metal (M2) layer that is immediately above the M1 layer, wherein the W_WL conductor is connected to the first W_WL landing pad through a level-1 via, and wherein the Vss power mesh conductor is connected to the first Vss conductor through another level-1 via. In a further embodiment, each of the first and the second TP SRAM cells further includes a R_WL conductor that is located at a fourth metal (M4) layer that is immediately above a third metal (M3) layer that is immediately above the M2 layer, wherein the R_WL conductor is electrically connected to the R_WL landing pad.

In another example aspect, the present disclosure is directed to a semiconductor structure that includes a substrate and an array of two-port (TP) SRAM cells over the substrate. Each of the array of TP SRAM cells includes a first half write port, a second half write port, and a read port. The second half write port is located between the first half write port and the read port. The first half write port includes a first write pass gate (W_PG) transistor, a first write pull-down (W_PD) transistor, and a first write pull-up (W_PU) transistor. The second half write port includes a second W_PG transistor, a second W_PD transistor, and a second W_PU transistor. The read port includes a read pass gate (R_PG) transistor and a read pull-down (R_PD) transistor. The array of TP SRAM cells includes a first TP SRAM cell and a second TP SRAM cell. The first half write port of the first TP SRAM cell abuts the first half write port of the second TP SRAM cell. Each of the first and the second TP SRAM cells includes a read bit line (R_BL) conductor, a first Vss conductor, a first write word line (W_WL) landing pad, a write bit line bar (W_BLB) conductor, a Vdd conductor, and a W_BL conductor that are all located at a first metal (M1) layer and are arranged in an order from the read port to the first half write port of the respective TP SRAM cell. The first and the second TP SRAM cells collectively include a shared W_WL landing pad and a shared Vss conductor that are located at the M1 layer and located between the W_BL conductor of the first TP SRAM cell and the W_BL conductor of the second TP SRAM cell.

In an embodiment of the semiconductor structure, the shared W_WL landing pad is located in the second TP SRAM cell and the shared Vss conductor is located in the first TP SRAM cell. In another embodiment, the R_BL conductor, the first Vss conductor, the first W_WL landing pad, the W_BLB conductor, the Vdd conductor, and the W_BL conductor of the first TP SRAM cell are mirror images of the R_BL conductor, the first Vss conductor, the first W_WL landing pad, the W_BLB conductor, the Vdd conductor, and the W_BL conductor of the second TP SRAM cell with respect to a boundary line between the first and the second TP SRAM cells.

In another embodiment, in each of the first and the second TP SRAM cells, each of the R_PG transistor and the R_PD transistor includes a multi-fin FinFET, and each of the first and second W_PG transistors, the first and second W_PD transistors, and the first and second W_PU transistors includes a single-fin FinFET.

In another embodiment, in each of the first and the second TP SRAM cells, each of the R_PG transistor, the R_PD transistor, the first and second W_PG transistors, the first and second W_PD transistors, and the first and second W_PU transistors includes a multi-fin FinFET, wherein the R_PG and R_PD transistors are formed with more semiconductor fins than the first and second W_PG transistors, the first and second W_PD transistors, and the first and second W_PU transistors.

In another embodiment, in each of the first and the second TP SRAM cells, each of the R_PG transistor, the R_PD transistor, the first and second W_PG transistors, the first and second W_PD transistors, and the first and second W_PU transistors includes a GAA transistor, wherein the R_PG transistor and the R_PD transistor have a wider transistor channel than the first and second W_PG transistors, the first and second W_PD transistors, and the first and second W_PU transistors.

In yet another example aspect, the present disclosure is directed to a semiconductor structure that includes a substrate and an array of two-port (TP) SRAM cells over the substrate. Each of the array of TP SRAM cells includes a write port and a read port. The array of TP SRAM cells includes first, second, third, and fourth TP SRAM cells. The write port of the first TP SRAM cell abuts the write port of the second TP SRAM cell to define a first boundary line. The first TP SRAM cell includes a first Vss conductor next to the first boundary line and a first write bit line (W_BL) conductor next to the first Vss conductor. The second TP SRAM cell includes a first write word line (W_WL) landing pad next to the first boundary line and a second W_BL conductor next to the first W_WL landing pad. The first Vss conductor, the first W_BL conductor, the first W_WL landing pad, and the second W_BL conductor are located at a first metal (M1) layer. Each of the first and the second TP SRAM cells further includes a Vdd conductor, a W_BLB conductor, a second W_WL landing pad, a second Vss conductor, and a read bit line (R_BL) conductor that are all located at a first metal (M1) layer and are arranged in an order from the write port to the read port of the respective TP SRAM cell. The first TP SRAM cell further includes a read word line (R_WL) conductor located at a second boundary line between the first TP SRAM cell and the third TP SRAM cell. The second TP SRAM cell further includes another R_WL conductor located at a third boundary line between the second TP SRAM cell and the fourth TP SRAM cell.

In an embodiment of the semiconductor structure, each of the first and the second TP SRAM cells further includes a W_WL conductor located at a second metal (M2) layer that is immediately above the M1 layer; the W_WL conductor is connected to the first W_WL landing pad through a level-1 via; and each of the first and the second TP SRAM cells further includes R_WL conductors that are located at two different metal layers above the M2 layer and are electrically connected. In a further embodiment, each of the first and the second TP SRAM cells further includes a R_WL landing pad that is located at the M2 layer, wherein the respective R_WL conductors are electrically connected to the R_WL landing pad.

In another embodiment, the write port includes first and second write pass gate (W_PG) transistors, first and second write pull-down (W_PD) transistors, and first and second write pull-up (W_PU) transistors, wherein the read port includes a read pass gate (R_PG) transistor and a read pull-down (R_PD) transistor, wherein each of the W_PG, W_PD, W_PU, R_PG, and R_PD transistors includes a FinFET or a GAA transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate; and
   an array of two-port (TP) SRAM cells over the substrate, wherein each of the array of TP SRAM cells includes a write port and a read port,
   wherein the array of TP SRAM cells includes a first TP SRAM cell and a second TP SRAM cell, the write port of the first TP SRAM cell abuts the write port of the second TP SRAM cell, the write port of the first TP SRAM cell includes a first write pull-down (W_PD) transistor, and the write port of the second TP SRAM cell includes a second W_PD transistor, the array of TP SRAM cells further includes a first source/drain contact landing on both a source/drain electrode of the first W_PD transistor and another source/drain electrode of the second W_PD transistor,
   wherein the first TP SRAM cell includes a first Vss conductor located at a first metal (M1) layer, the first Vss conductor is directly above the first source/drain contact and connected to the first source/drain contact.

2. The semiconductor structure of claim 1, wherein the write port of the first TP SRAM cell further includes a first write pass gate (W_PG) transistor, the write port of the second TP SRAM cell further includes a second W_PG transistor, and the first and the second W_PG transistors share a common gate electrode.

3. The semiconductor structure of claim 2, wherein the write port of the second TP SRAM cell further includes a first write word line (W_WL) landing pad that is connected to the common gate electrode through a gate via.

4. The semiconductor structure of claim 3, wherein the first W_WL landing pad is located at the M1 layer and is next to the first Vss conductor.

5. The semiconductor structure of claim 4, wherein the write port of the second TP SRAM cell further includes a write bit line (W_BL) located at the M1 layer, wherein the first W_WL landing pad is located between the first Vss conductor and the W_BL.

6. The semiconductor structure of claim 1, wherein the first Vss conductor is connected to the first source/drain contact through a source/drain contact via.

7. The semiconductor structure of claim 1, wherein, in a cross-sectional view, each of the first and the second W_PD transistors includes a gate electrode engaging multiple semiconductor fins.

8. The semiconductor structure of claim 1, wherein, in a cross-sectional view, each of the first and the second W_PD transistors includes a gate electrode wrapping around multiple semiconductor channels.

9. The semiconductor structure of claim 1, wherein the write port of the first TP SRAM cell further includes a write bit line (W_BL), wherein the W_BL is located at the M1 layer and is next to the first Vss conductor.

10. A semiconductor structure, comprising:
    a substrate; and
    first and second two-port (TP) SRAM cells over the substrate, wherein each of the first and the second TP SRAM cells includes a write port and a read port,
    wherein the write port of the first TP SRAM cell shares a cell boundary with the write port of the second TP SRAM cell, the write port of the first TP SRAM cell includes a first write pass gate (W_PG) transistor, the write port of the second TP SRAM cell includes a second W_PG transistor, the first and the second W_PG transistors share a common gate electrode that extend across the cell boundary, the write port of the second TP SRAM cell further includes a first write word line (W_WL) landing pad that is connected to the common gate electrode through a gate via.

11. The semiconductor structure of claim 10, wherein the first W_WL landing pad is located at a first metal (M1) layer and is oriented lengthwise perpendicular to the common gate electrode from a top view.

12. The semiconductor structure of claim 10, wherein the write port of the first TP SRAM cell further includes a first write pull-down (W_PD) transistor, the write port of the second TP SRAM cell further includes a second W_PD transistor, further comprising:
    a first source/drain contact landing on both a source/drain electrode of the first W_PD transistor and another source/drain electrode of the second W_PD transistor, the first source/drain contact extending lengthwise parallel to the common gate electrode and extending across the cell boundary.

13. The semiconductor structure of claim 12, wherein the write port of the first TP SRAM cell further includes a first Vss conductor, the first Vss conductor is directly above the first source/drain contact and connected to the first source/drain contact through a source/drain contact via.

14. The semiconductor structure of claim 13, wherein the first Vss conductor and the first W_WL landing pad are located at a first metal (M1) layer and are oriented lengthwise perpendicular to the common gate electrode from a top view.

15. The semiconductor structure of claim 14, wherein the write port of the first TP SRAM cell further includes a first write bit line (W_BL), the write port of the second TP SRAM cell further includes a second W_BL, wherein the second W_BL, the first W_WL landing pad, the first Vss conductor, and the first W_BL are located at the M1 layer and are next to each other.

16. The semiconductor structure of claim 10, wherein, in a cross-sectional view, each of the first and the second W_PG transistors includes a gate electrode engaging multiple semiconductor fins or wrapping around multiple semiconductor channels.

17. A semiconductor structure, comprising:
a substrate; and
first and second two-port (TP) SRAM cells over the substrate, wherein each of the first and the second TP SRAM cells includes a write port and a read port,
wherein the write port of the first TP SRAM cell shares a cell boundary with the write port of the second TP SRAM cell, the write port of the first TP SRAM cell includes a first write pass gate (W_PG) transistor and a first write pull-down (W_PD) transistor, the write port of the second TP SRAM cell includes a second W_PG transistor and a second W_PD transistor, the first and the second W_PG transistors share a common gate electrode that extend across the cell boundary, the write port of the first TP SRAM cell further includes a first Vss conductor and a first write bit line (W_BL), the write port of the second TP SRAM cell further includes a first write word line (W_WL) landing pad and a second W_BL, wherein the first W_BL, the first Vss conductor, the first W_WL landing pad, and the second W_BL are located at a first metal (M1) layer and are next to each other.

18. The semiconductor structure of claim 17, wherein the first W_WL landing pad is connected to the common gate electrode through a gate via.

19. The semiconductor structure of claim 17, further comprising:
a first source/drain contact landing on both a source/drain electrode of the first W_PD transistor and another source/drain electrode of the second W_PD transistor,
wherein the first Vss conductor is directly above the first source/drain contact and connected to the first source/drain contact through a source/drain contact via.

20. The semiconductor structure of claim 17, wherein:
the write port of the first TP SRAM cell further includes a first Vdd conductor, a first write bit line bar (W_BLB), and a second W_WL landing pad,
the read port of the first TP SRAM cell includes a second Vss conductor and a first read bit line (R_BL),
the write port of the second TP SRAM cell further includes a second Vdd conductor, a second W_BLB, and a third W_WL landing pad,
the read port of the second TP SRAM cell includes a third Vss conductor and a second R_BL, and
the first and second Vdd conductors, the first and second W_BLB, the second and third W_WL landing pads, and the first and second R_BL are all located at the M1 layer.

* * * * *